United States Patent
Thakkar et al.

(10) Patent No.: US 11,626,840 B2
(45) Date of Patent: Apr. 11, 2023

(54) SUBHARMONIC DETECTION AND CANCELATION

(71) Applicant: TEXAS INSTRUMENTS INCORPORATED, Dallas, TX (US)

(72) Inventors: Arpan Sureshbhai Thakkar, Gujarat (IN); Pranav Kumar, Ranchi (IN); Yogesh Darwhekar, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/462,941

(22) Filed: Aug. 31, 2021

(65) Prior Publication Data

US 2023/0061672 A1    Mar. 2, 2023

(51) Int. Cl.
*H03D 7/14* (2006.01)
*H03K 5/1252* (2006.01)

(52) U.S. Cl.
CPC ......... *H03D 7/1441* (2013.01); *H03K 5/1252* (2013.01)

(58) Field of Classification Search
CPC ... H04B 1/30; H04B 1/28; H04B 1/40; H04B 1/26; H04B 1/0475; H04B 1/04; H04B 1/525; H04B 1/16; H03D 7/165; H03D 7/1458; H03D 3/007; H03D 7/00; H03D 7/1433; H03D 3/009; H03D 7/1466; H03D 7/1483; H03D 7/1441; H03F 2200/451; H03F 3/19; H03F 2200/294; H03B 19/00;

(Continued)

(56) References Cited

U.S. PATENT DOCUMENTS 8,571,510 B2 * 10/2013 Liu ..................... H03F 1/56
455/313
9,712,113 B2 * 7/2017 Selvanayagam ..... H03D 7/1441
(Continued)

OTHER PUBLICATIONS

Brad R. Jackson, Francesco Mazzilli, Carlos E. Saavedra, "A Frequency Tripler Using a Subharmonic Mixer and Fundamental Cancellation" IEEE Transactions on Microwave Theory and Techniques, vol. 57, No. 5, May 2009.

*Primary Examiner* — John W Poos
(74) *Attorney, Agent, or Firm* — Valerie M. Davis; Frank D. Cimino

(57) ABSTRACT

A circuit for subharmonic detection includes in-phase and quadrature mixers, first and second filters, and a processing circuit. The in-phase mixer has a first mixer input and a first mixer output. The quadrature mixer has a second mixer input and a second mixer output, the first mixer input coupled to the second mixer input. The first filter circuit has a first filter input and a first filter output, the first filter input coupled to the first mixer output. The second filter circuit has a second filter input and a second filter output, the second filter input coupled to the second mixer output. The processing circuit has a first input and a second input, the first input of the processing circuit coupled to the first filter output, the second input of the processing circuit coupled to the second filter output. The processing circuit is configured to detect a subharmonic component of a wave at the first mixer input and the second mixer input using a first direct current (DC) component at the first input of the processing circuit and a second DC component at the second input of the processing circuit.

19 Claims, 13 Drawing Sheets

(58) Field of Classification Search
CPC .......... H03B 27/00; H03L 7/087; H03L 7/07; H03K 5/1252; G06F 1/08
See application file for complete search history.

(56) References Cited

U.S. PATENT DOCUMENTS

2009/0191833 A1* 7/2009 Kaczman ............ H03F 3/45183
455/296
2016/0380592 A1* 12/2016 Rajendran ............ H03D 7/1483
455/118

* cited by examiner

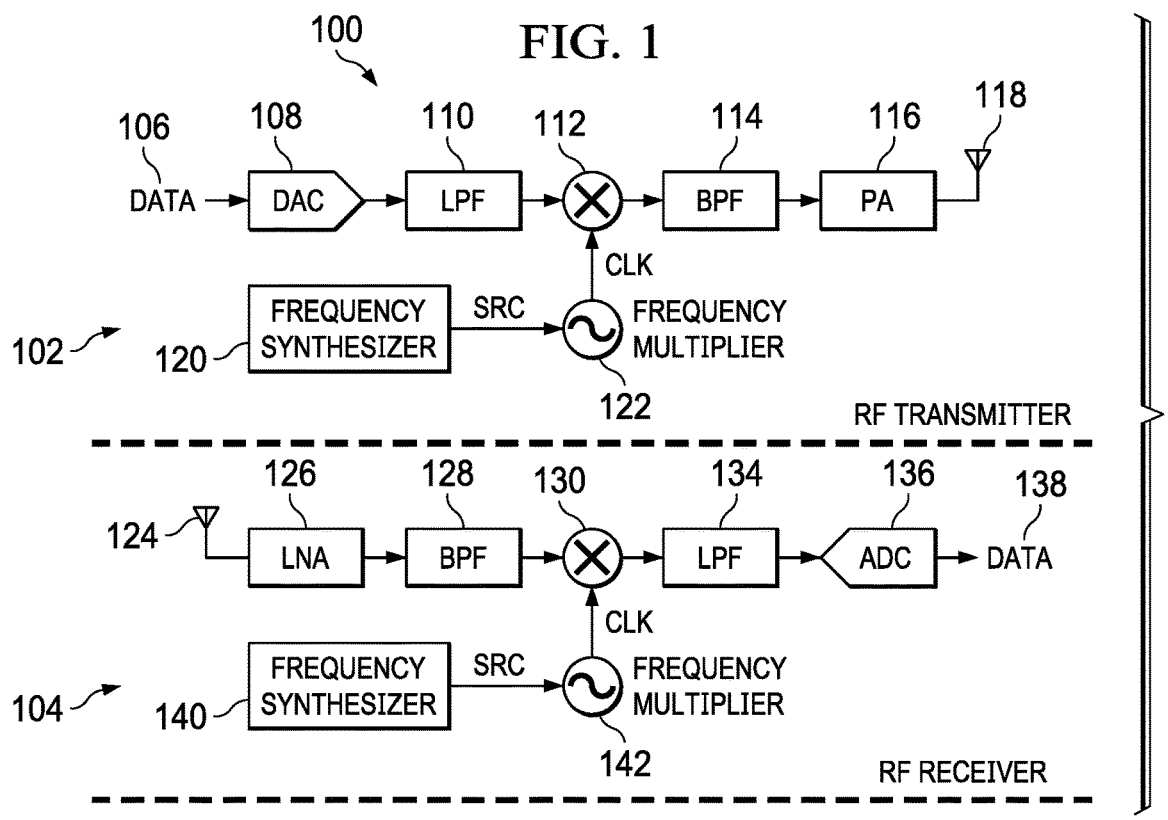
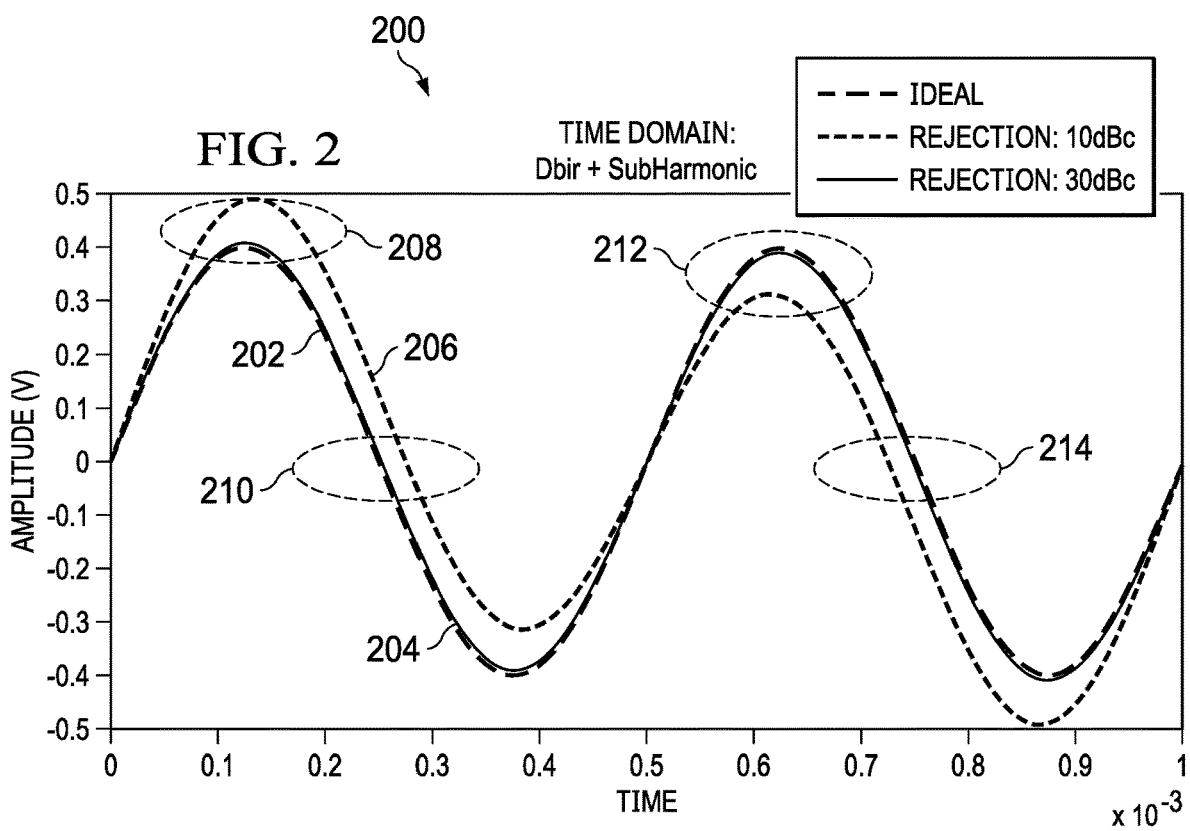

FIG. 15
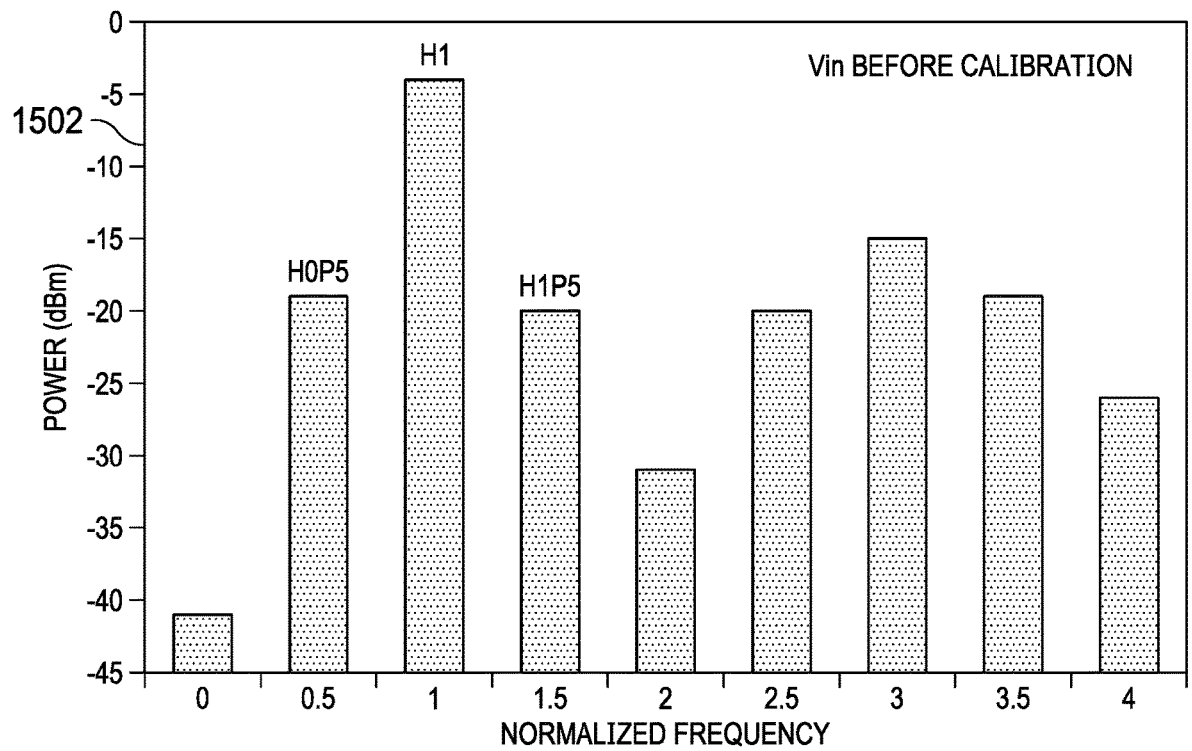
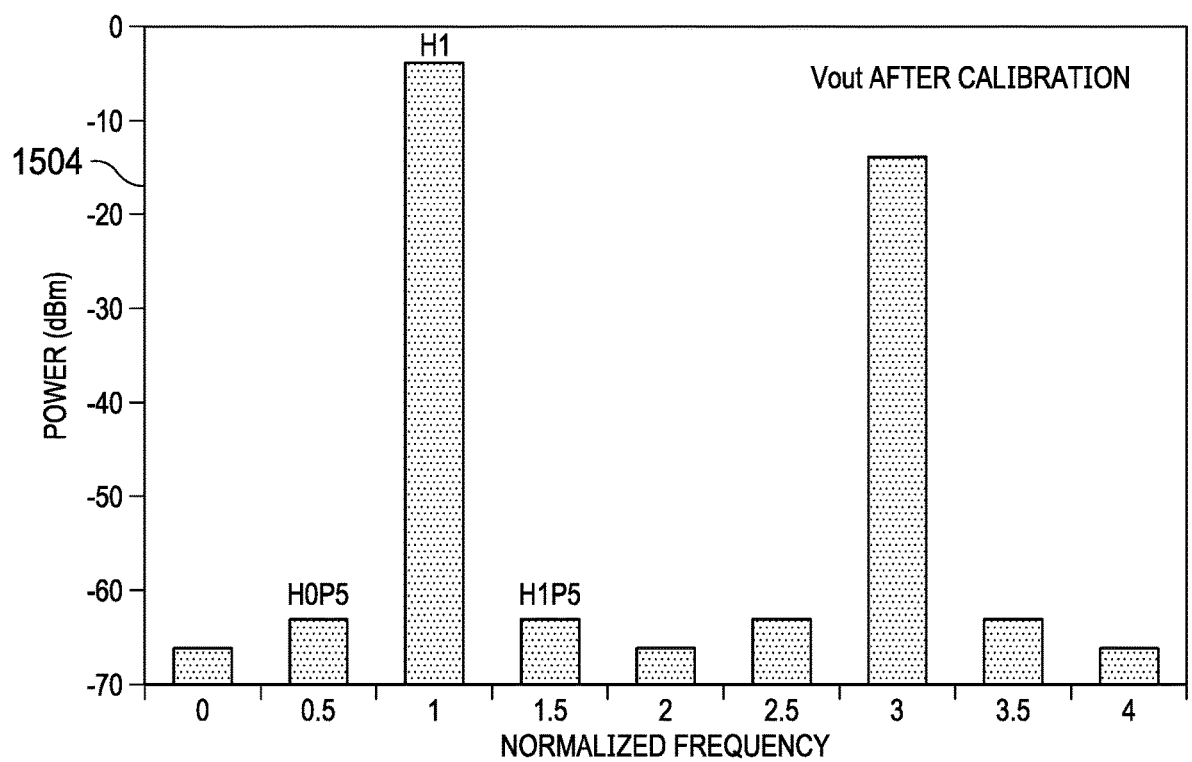

SUBHARMONIC DETECTION AND CANCELATION

TECHNICAL FIELD

This relates generally to clock generation circuitry, and more particularly to subharmonic detection and cancelation for the clock generation circuitry.

BACKGROUND

Clock generation circuitry is used to generate a period wave referred to as a clock signal. A clock signal may be used in many applications such as circuit synchronization and radio frequency (RF) and millimeter wave (mmWave) wireless communications. For example, a transmitter (for instance included in transceiver circuitry) may use one or more clock signals to upconvert a data-carrying signal from baseband to RF or mmWave frequency for transmission to a remote receiver. Similarly, a receiver (of the transceiver circuitry) may use one or more clock signals to downconvert a data-carrying signal, received from a remote transmitter, from RF or mmWave frequency to baseband to recover the data. To generate a desired frequency for the clock signal, the clock generation circuitry may include a frequency multiplier. The frequency multiplier receives a source signal, for instance from a frequency synthesizer, and generates, therefrom, the clock signal. The clock signal has a desired frequency component, which is a multiple of the frequency of the source signal but may also include unwanted subharmonic components (also referred to herein as subharmonics or subharmonic leakage). Subharmonics are wave components at frequencies that are less than the desired frequency. For example, a subharmonic of the clock signal may be a wave component having the frequency of the source signal. Subharmonic leakage distorts the clock signal, which may degrade performance in some applications. For example, subharmonic leakage in RF and mmWave transceivers may cause adverse effects including distortion in the up/down-converted signal and/or out-of-band emissions. Mechanisms for subharmonic cancelation can reduce these adverse effects.

SUMMARY

In one example, a circuit for subharmonic detection includes in-phase and quadrature mixers, first and second filters and a processing circuit. The in-phase mixer has a first mixer input and a first mixer output. The quadrature mixer has a second mixer input and a second mixer output, the first mixer input coupled to the second mixer input. The first filter circuit has a first filter input and a first filter output, the first filter input coupled to the first mixer output. The second filter circuit has a second filter input and a second filter output, the second filter input coupled to the second mixer output. The processing circuit has a first input and a second input, the first input of the processing circuit coupled to the first filter output, the second input of the processing circuit coupled to the second filter output. The processing circuit is configured to detect a subharmonic component of a wave at the first mixer input and the second mixer input using a first direct current (DC) component at the first input of the processing circuit and a second DC component at the second input of the processing circuit.

In another example, a subharmonic detection and correction circuit include a subtractor, first in-phase and first quadrature mixers, first and second filters, a processing circuit, and second adjustable in-phase and second adjustable quadrature mixers. The subtractor has a frequency multiplier input, a feedback input, and a subtractor output. The first in-phase mixer has first and second mixer inputs and a first mixer output, the first mixer input coupled to the subtractor output. The first quadrature mixer has third and fourth mixer inputs and a second mixer output, the third mixer input coupled to the subtractor output. The first filter circuit has a first filter input has a first filter output, the first filter input coupled to the first mixer output. The second filter circuit has a second filter input and a second filter output, the second filter input coupled to the second mixer output. The processing circuit has first and second inputs and first and second outputs, the first input of the processing circuit coupled to the first filter output, the second input of the processing circuit coupled to the second filter output. The second adjustable in-phase mixer has fifth and sixth mixer inputs and a third mixer output, the fifth mixer input coupled to the first output of the processing circuit, and the sixth mixer input coupled to the second mixer input. The second adjustable quadrature mixer has seventh and eighth mixer inputs and a fourth mixer output, the seventh mixer input coupled to the second output of the processing circuit, the eighth mixer input coupled to the fourth mixer input, the third and fourth mixer outputs coupled together and to the feedback input.

In another example, a method for subharmonic detection and correction includes receiving a wave from a frequency multiplier. The method further includes mixing the wave with a first mixing signal to generate a first mixed signal including a first direct current (DC) component, and mixing the wave with a second mixing signal to generate a second mixed signal including a second DC component. The second mixing signal is phase-shifted from the first mixing signal. The method further includes determining that the first and second DC components indicate a subharmonic component, and responsive to the determining, adjusting a parameter of an adjustable mixer to provide a feedback correction signal. The method also includes combining the feedback correction signal with the wave from the frequency multiplier to generate a corrected wave having a reduced subharmonic.

BRIEF DESCRIPTION OF THE DRAWINGS

FIG. 1 is a block diagram depicting an example transceiver circuit that includes frequency multipliers that may implement subharmonic detection and cancelation.

FIG. 2 is a graph diagram depicting example waves that illustrate the impact of subharmonic leakage in a clock signal.

FIG. 15 is a graph diagram illustrating example subharmonic rejection when operating the circuit shown in FIG. 10.

DETAILED DESCRIPTION OF EXAMPLE EMBODIMENTS

Figure 3:
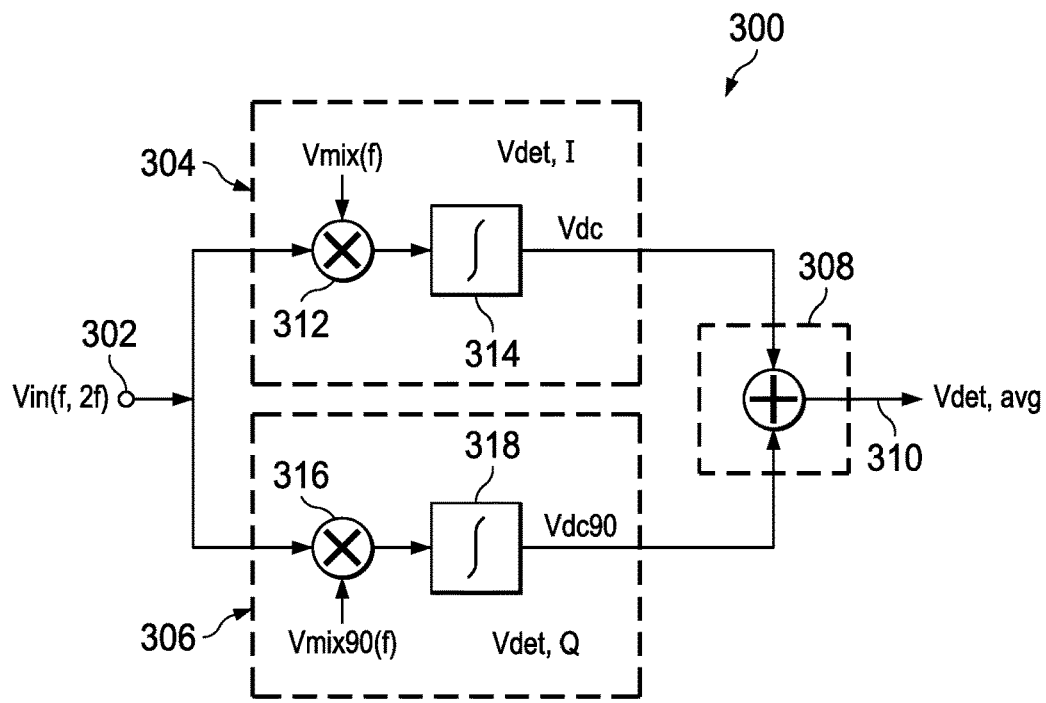
FIG. 3 is a block diagram depicting an example circuit for subharmonic detection.

One example solution for generating a clock signal having a desired frequency is to use a phase-locked loop (PLL) and a frequency synthesizer. This closed-loop solution can generate a clock signal without (or with reduced) subharmonics because the source signal into the circuitry and the clock signal out of the circuitry are phase-aligned using the PLL. However, some of the circuit components, including a voltage-controlled oscillator, a frequency divider, a charge pump, a counter, a phase detector, etc., may lead to a bulky solution.

An example frequency domain solution uses a multi-stage tunable band-pass filter bank coupled to the output of a frequency multiplier to reduce subharmonics in the clock signal. This solution is simple to implement but requires a relatively large die area. Moreover, subharmonics that are coupled into the circuitry after the filter bank, for instance due to a shared power supply and/or ground coupling, are not suppressed by the filter bank.

In an example time domain open-loop solution, a clock signal from clock generation circuitry is observed. Results of the observation are used to manually tune a phase shifter and an amplitude control circuit to generate a correction signal. The phase shifter and amplitude control circuit are coupled in a feedforward path between an input which provides a source signal and the input of a subtractor circuit. The subtractor circuit subtracts the correction signal from a signal at the output of a frequency multiplier to provide the clock signal with reduced harmonics. This solution requires less die area to implement than the PLL and frequency domain solutions. However, example shortcomings include: requiring manual calibration across process, voltage, and temperature (PVT) changes; and sensitivity of the subharmonic rejection to amplitude and phase mismatch of the correction signal.

Described examples include circuits and methods for subharmonic detection and cancelation. Example circuits include in-phase and quadrature (IQ) mixers and respective filters coupled to an output of a frequency multiplier to generate direct current (DC) signals. The DC signals are used to detect harmonics in a signal at the output of the frequency multiplier. Using IQ mixers instead of a single phase mixer enables subharmonic detection even where the subharmonic component is 90 degrees phase-shifted from one of the IQ mixing signals provided into the IQ mixers.

The example circuits further include DC processing circuitry and additional IQ mixers that generate a correction or cancelation signal responsive to the DC signals. Using negative feedback coupling, the correction signal is automatically subtracted from the signal at the output of the frequency multiplier to cancel subharmonics from an output clock signal. The negative feedback enables automatic subharmonic cancelation across PVT changes, in contrast to the time domain open-loop solution. Moreover, the solution according to the described examples is more area efficient that the PLL and frequency domain solutions.

Additionally, at least one example circuit includes hard-limiters to generate square waves to facilitate "large signal" processing, in which subharmonic cancelation may be performed by adjusting the zero crossing of the corrupted signal. This particular approach is less sensitive to amplitude and phase mismatch of the IQ mixing signals.

Referring initially to FIG. 1, which is a block diagram depicting an example transceiver circuit 100 that includes frequency multipliers that may implement subharmonic detection and cancelation. The transceiver circuit 100 includes transmitter circuitry 102 and receiver circuitry 104. In one example, transceiver circuit 100 transmits and receives signals having frequencies in the RF spectrum. In another example, transceiver circuit 100 transmits and receives signals having frequencies in the mmWave frequency spectrum. Transceiver circuit 100 may be included in devices such as mobile phones, tablets, and internet-of-things (IoT) devices, to name a few.

Transmitter circuitry 102 includes a digital to analog converter (DAC) 108, a lowpass filter (LPF) 110, a mixer 112, a bandpass filter (BPF) 114, a power amplifier (PA) 116, an antenna 118, a frequency synthesizer 120, and a frequency multiplier 122, each having one or more respective inputs and/or outputs and/or interconnections as shown. More particularly, the output of DAC 108 is coupled to the input of LPF 110. The output of LPF 110 is coupled to the first input of mixer 112. The output of mixer 112 is coupled to the input of BPF 114. The output of BPF 114 is coupled to the input of PA 116. The output of PA 116 is coupled to the input of antenna 118. The output of frequency synthesizer 120 is coupled to the input of frequency multiplier 122, and the output of frequency multiplier 122 is coupled to the second input of mixer 112.

During operation of transmitter circuitry 102, frequency synthesizer 120 generates a source wave (SRC) having a frequency of f. For example, SRC is a sinusoidal wave where f is 1 megahertz (MHz). In this example, transmitter circuitry 102 transmits data-carrying signals at a frequency that is a multiple of f, for instance 2f or 2 MHz in this example. Accordingly, frequency multiplier 122 generates a clock signal, CLK having a frequency of 2f.

Additionally, digital data 106 is provided at the input of DAC 108. DAC 108 converts the digital data 106 into an analog data-carrying signal provided at the output of DAC 108. LPF 110 operates as a reconstruction filter that bandlimits the analog data-carrying signal to reduce imaging. Mixer 112 upconverts the analog data-carrying signal, at the output of LPF 110, from baseband to the transmission frequency 2f. BPF 114 attenuates frequencies of the upconverted signal that are outside of a selected range of frequencies. PA 116 amplifies the upconverted data-carrying signal and passes the amplified signal to transmitter 118 for transmitting to a remote receiver.

Receiver circuitry 104 includes an antenna 124, a low-noise amplifier (LNA) 126, a bandpass filter (BPF) 128, a mixer 130, a lowpass filter (LPF) 134, an analog-to-digital converter (ADC) 136, a frequency synthesizer 140, and a frequency multiplier 142, each having one or more respective inputs and/or outputs and/or interconnections as shown. More particularly, the output of antenna 124 is coupled to the input of LNA 126. The output of LNA 126 is coupled to the input of BPF 128. The output of BPF 128 is coupled to the first input of mixer 130. The output of mixer 130 is coupled to the input of LPF 134. The output of LPF 134 is coupled to the input of ADC 136. The output of frequency synthesizer 140 is coupled to the input of frequency multiplier 142, and the output of frequency multiplier 142 is coupled to the second input of mixer 130.

During operation of receiver circuitry 104, frequency synthesizer 140 generates SRC having the frequency f, and frequency multiplier 142 generates, from SRC, CLK having the frequency 2f. Additionally, antenna 124 receives an analog data-carrying signal from a remote transmitter, which is passed to LNA 126. LNA 126 amplifies the analog data-carrying signal and provides an amplified analog data-carrying signal at its output. BPF 128 bandlimits the amplified signal. Mixer 130 downconverts the bandlimited amplified data-carrying signal, for instance to baseband. LPF 134 operates as an anti-aliasing filter that further bandlimits the downconverted signal to reduce aliasing. ADC 136 samples the downconverted and bandlimited signal to retrieve data 138.

DAC 108, LPFs 110 and 134, mixers 112 and 130, BPFs 114 and 128, PA 116, antennas 118 and 124, LNA 126, ADC 136, and frequency synthesizers 120 and 140 may be implemented using any suitable circuitry. Frequency multipliers 122 and 142 may also contain any suitable circuitry to generate a clock signal having a fundamental component at a frequency that is a multiple of f. Moreover, frequency multipliers 122 and 142 contain or is coupled to circuitry according to examples herein to remove subharmonics from the clock signal to provide CLK at the respective outputs.

In one example, transceiver circuit 100 is implemented as a single integrated circuit (IC), or IC package, built on a single piece of silicon. Alternatively, transceiver circuit 100 may be implemented as multiple ICs and/or multiple IC packages (each package having one or more ICs), with the multiple ICs or IC packages coupled to or mounted on a printed circuit board (PCB). For example, transmitter circuitry 102 and receiver circuitry 104 are implemented in respective separate one or more ICs or IC packages. In another example, frequency synthesizer 120 and frequency multiplier 122 are implemented on at least one separate IC from other components of transmitter circuitry 102. Moreover, frequency multiplier 122 may be implemented on a separate IC from frequency synthesizer 120. Similarly, in an example, frequency synthesizer 140 and frequency multiplier 142 are implemented on at least one separate IC from other components of receiver circuitry 104. Moreover, frequency multiplier 142 may be implemented on a separate IC from frequency synthesizer 140. In a further example, transmitter circuitry 102 and receiver circuitry 104 share a frequency synthesizer and frequency multiplier, which may be implemented in one or more ICs or IC packages.

FIG. 2 is a graph diagram 200 depicting example waves 202, 204, and 206 that illustrate the impact of subharmonic leakage in a clock signal, such as CLK generated by frequency multiplier 122 or 142 shown in FIG. 1. Each of waves 202, 204, and 206 represents an amplitude of CLK (in volts (V)) plotted over time (in milliseconds (mS)), where the frequency multiplier (which generates CLK) is a frequency doubler. In this example, wave 202 represents an ideal CLK with no subharmonic leakage. Wave 204 represents CLK with 30 decibels (dB) of subharmonic rejection, and wave 206 represents CLK with 10 dB of subharmonic rejection.

The waves 202, 204, 206 illustrate that a 30 dB subharmonic rejection provides a CLK that is close to ideal. However, a 10 dB subharmonic rejection in CLK provides a deviation from the ideal clock signal which may degrade performance of transceiver circuit 100. Moreover, as can be seen, addition of subharmonic components to the fundamental component of CLK doesn't change an average duty cycle of the signal. However, as shown at 210 the half cycle of wave 206 is stretched relative to the half cycle of wave 202, and as shown at 214 the half cycle of wave 206 is shrunk relative to the half cycle of wave 202, which indicates that alternating half cycles of wave 206 have opposite non-50% duty cycles. Moreover, 208 and 212 illustrate amplitude mismatches in wave 206, which indicates presence of one or more subharmonic components. Circuitry according to the disclosed examples can detect the presence of subharmonic components as a consequence of these amplitude mismatches and/or phase-mismatches at the half cycles and automatically correct for these subharmonic components.

FIG. 3 is a block diagram depicting an example circuit 300 for subharmonic detection. As illustrated, circuit 300 includes an in-phase detection circuit ($V_{det, I}$) 304, a quadrature detection circuit ($V_{det, Q}$) 306, and a processing circuit 308, each having one or more components with one or more inputs and/or outputs and/or interconnections coupled as shown between an input terminal 302 and an output terminal 310 of circuit 300.

In a further example, circuit 300 is included in or coupled to frequency multipliers 122 and 142 of transceiver circuit 100 to detect subharmonic components in CLK. Accordingly, in transmitter circuitry 102, the input terminal 302 is coupled to the output of frequency multiplier 122. Moreover, the output terminal 310 is coupled to circuitry (not shown) that may be used for subharmonic correction, an output of which may be coupled to mixer 112. Similarly, in receiver circuitry 104, the input terminal 302 is coupled to the output of frequency multiplier 142. Moreover, the output terminal 310 is coupled to circuitry (not shown) that may be used for subharmonic correction, an output of which may be coupled to mixer 130.

As further shown in FIG. 3, $V_{det, I}$ 304 includes an in-phase (I) mixer 312 and a filter 314, and $V_{det, Q}$ 306 includes a quadrature (Q) mixer 316 and a filter 318. The first (frequency multiplier) input of mixer 312 is coupled to the input terminal 302, and its output is coupled to the input of filter 314. The output of filter 314 is coupled to the first input of processing circuit 308. The first (frequency multiplier) input of mixer 316 is coupled to the input terminal 302, and its output is coupled to the input of filter 318. The output of filter 318 is coupled to the second input of processing circuit 308.

As illustrated, mixers 312 and 316 collectively implement an IQ mixer. As such, a first mixing signal $V_{mix(f)}$ is provided at the second (mixing signal) input of mixer 312, and a second mixing signal $V_{mix90(f)}$ is provided at the (mixing signal) second input of mixer 316. The mixing signals are also collectively referred to herein as IQ mixing signals. In this example, $V_{mix(f)}$ and $V_{mix90(f)}$ are sinusoidal signals. Also, $V_{mix(f)}$ has a frequency of f, which is the frequency of SRC. $V_{mix90(f)}$ has a frequency that is phase-shifted about 90° from f. For example, $V_{mix(f)}$ and $V_{mix90(f)}$ are generated from SRC using a quadrature signal generator, which may be implemented as a polyphase filter. Using an IQ mixer enables subharmonic detection for a subharmonic component that is 90° phase-shifted from one of the mixing signals since the other mixing signal can be used for the detection.

In one example, the filters 314 and 318 are each implemented as a respective low-pass filter. Alternatively, the filters 314 and 318 are each implemented as a respective integrator circuit. In an example, the processing circuit 308 includes one or more logic gates and/or combinational logic circuits that performs an addition or integration operation (as shown) to detect the presence of subharmonics and provide a detection signal, $V_{det,\ avg}$ in this example. The detection signal may be used in subharmonic cancelation. Alternatively, or additionally, the processing circuit 308 is implemented as a microprocessor, for instance which executes code, to detect the presence of subharmonics using signals at its first and second inputs and provide a detection signal at its output.

Figure 4:
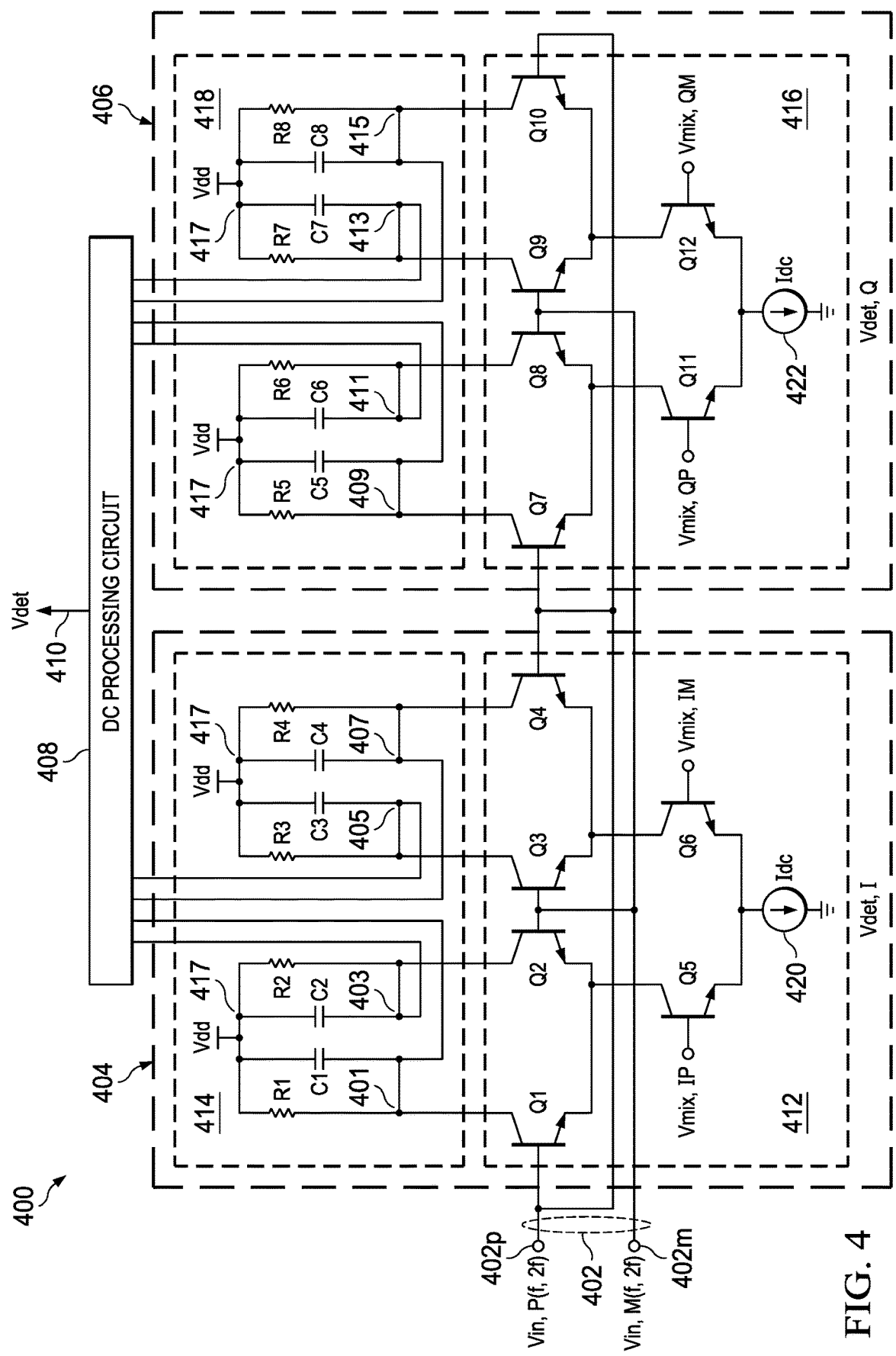
FIG. 4 is a schematic circuit diagram depicting an example circuit for subharmonic detection that implements the circuit shown in FIG. 3.

FIG. 4 is a schematic circuit diagram depicting an example circuit 400 for subharmonic detection that implements the circuit shown in FIG. 3. As illustrated, circuit 400 includes an in-phase detection circuit ($V_{det,\ I}$) 404, a quadrature detection circuit ($V_{det,\ Q}$) 406, and a direct current (DC) processing circuit 408, each having one or more components with one or more inputs and/or outputs and/or interconnections coupled as shown between differential input terminals $402_M$ and $402_P$ (collectively referred to as differential input terminals 402) and an output terminal 410 of circuit 400. In this example, $V_{det,\ I}$ 404 is an implementation of $V_{det,\ I}$ 304, $V_{det,\ Q}$ 406 is an implementation of $V_{det,\ Q}$ 306, and DC processing circuit 408 is an implementation of processing circuit 308. Moreover, in this example, circuit 400 is implemented as a differential circuit but need not be.

In a further example, circuit 400 is included in or coupled to frequency multipliers 122 and 142 of transceiver circuit 100 to detect subharmonic components in CLK. In the example transmitter circuitry 102, differential input terminals 402 are coupled to the output of frequency multiplier 122. Moreover, the output terminal 410 is coupled to circuitry (not shown) that may be used for subharmonic correction, an output of which may be coupled to mixer 112. Similarly, in the example receiver circuitry 104, differential input terminals 402 are coupled to the output of frequency multiplier 142. Moreover, the output terminal 410 is coupled to circuitry (not shown) that may be used for subharmonic correction, an output of which may be coupled to mixer 130.

As further shown in FIG. 4, $V_{det,\ I}$ 404 includes an in-phase (I) mixer 412 and a filter 414, and $V_{det,\ Q}$ 406 includes a quadrature (Q) mixer 416 and a filter 418. In this example, mixer 412 and filter 414 are implementations of mixer 312 and filter 314, and mixer 416 and filter 418 are implementations of mixer 316 and filter 318. Mixer 412 includes transistors Q1, Q2, Q3, Q4, Q5, and Q6, and a current source 420 that generates a current having a magnitude of $I_{dc}$. Filter 414 includes resistors R1, R2, R3, and R4 and capacitors C1, C2, C3, and C4. Transistors Q1-Q6 are illustrated as NPN bipolar junction transistors (BJTs). However, in other examples, one or more of transistors Q1-Q6 may be a PNP BJT or a field-effect transistor (FET) such as a metal-oxide semiconductor field-effect transistor (MOSFET).

As further shown, the current source 420 has a first terminal coupled to the respective emitters of transistors Q5 and Q6 and a second terminal coupled to electrical ground. The collector of transistor Q5 is coupled to the respective emitters of transistors Q1 and Q2, and the collector of transistor Q6 is coupled to the respective emitters of transistors Q3 and Q4. The bases of transistors Q1 and Q4 are coupled to input terminal $402_P$, and the bases of transistors Q2 and Q3 are coupled to input terminal $402_M$. The collector of transistor Q1 is coupled to a node 401. The collector of transistor Q2 is coupled to a node 403. The collector of transistor Q3 is coupled to a node 405. The collector of transistor Q4 is coupled to a node 407. Resistor R1 and capacitor C1 are coupled in parallel between a voltage supply node 417 and node 401. The voltage supply node 417 is, in turn, coupled to a voltage supply $V_{dd}$. Resistor R2 and capacitor C2 are coupled in parallel between voltage supply node 417 and node 403. Resistor R3 and capacitor C3 are coupled in parallel between voltage supply node 417 and node 405. Resistor R4 and capacitor C4 are coupled in parallel between voltage supply node 417 and node 407. Nodes 401, 403, 405, and 407 are coupled to respective inputs of DC processing circuit 408.

Similarly, mixer 416 includes transistors Q7, Q8, Q9, Q10, Q11, and Q12, and a current source 422 that generates a current having the magnitude of $I_{dc}$. Filter 418 includes resistors R5, R6, R7, and R8 and capacitors C5, C6, C7, and C8. Transistors Q7-Q12 are illustrated as NPN BJTs. However, in other examples, one or more of transistors Q7-Q12 may be a PNP BJT or a FET such as a MOSFET. Moreover, in an example, $I_{dc}$ and R1-R8 are chosen as per input voltage requirements of DC processing circuit block 408 to detect fine and large subharmonic content.

As further shown, the current source 422 has a first terminal coupled to the respective emitters of transistors Q11 and Q12 and a second terminal coupled to electrical ground. The collector of transistor Q11 is coupled to the respective emitters of transistors Q7 and Q8, and the collector of transistor Q12 is coupled to the respective emitters of transistors Q9 and Q10. The bases of transistors Q7 and Q10 are coupled to input terminal $402_P$, and the bases of transistors Q8 and Q9 are coupled to input terminal $402_M$. The collector of transistor Q7 is coupled to a node 409. The collector of transistor Q8 is coupled to a node 411. The collector of transistor Q9 is coupled to a node 413. The collector of transistor Q10 is coupled to a node 415. Resistor R5 and capacitor C5 are coupled in parallel between voltage supply node 417 and node 409. Resistor R6 and capacitor C6 are coupled in parallel between voltage supply node 417 and node 411. Resistor R7 and capacitor C7 are coupled in parallel between voltage supply node 417 and node 413. Resistor R8 and capacitor C8 are coupled in parallel between voltage supply node 417 and node 415. Nodes 409, 411, 413, and 415 are coupled to respective inputs of DC processing circuit 408.

Figure 5:
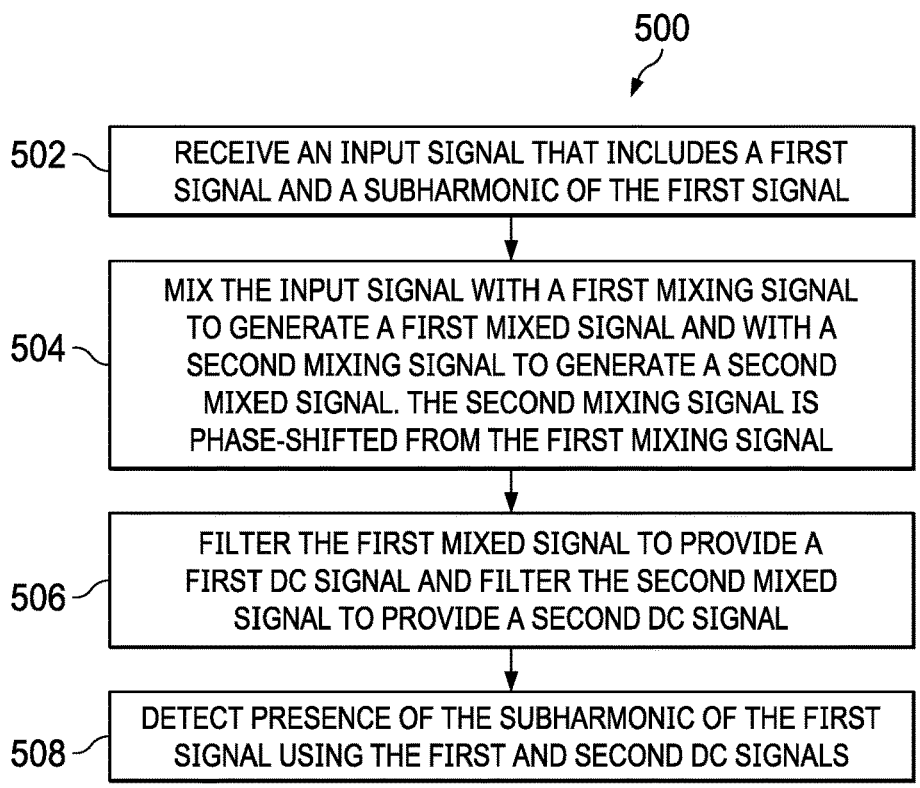
FIG. 5 is a flow diagram depicting an example method for subharmonic detection.

FIG. 5 is a flow diagram depicting an example method 500 for subharmonic detection. Method 500 may be performed while operating circuit 300 or circuit 400. Namely, at block 502 the subharmonic detection circuit, e.g., 300 or 400, receives an input signal that includes a first signal and a subharmonic of the first signal. During operation of circuit 300 at block 502, the input wave $V_{in(f,2f)}$ from the frequency multiplier 122 or 142 is received at input terminal 302. $V_{in(f,2f)}$ includes a first signal, in this case a fundamental component having the frequency 2f. $V_{in(f,2f)}$ also includes a subharmonic of the fundamental component, which in this example is a subharmonic component having the frequency f, which is the frequency of SRC. $V_{in(f,2f)}$ may also include other subharmonics and/or harmonics of the fundamental component, which may be corrected using one or more examples disclosed herein or modifications thereof. Alternatively, the additional subharmonics and/or harmonics may not impact performance of transceiver circuit 100 to the extent of the subharmonic at the frequency f.

In this example, $V_{in(f,2f)}$ is provided at the first input of mixer 312 and at the first input of mixer 316. Moreover, the first mixing signal $V_{mix(f)}$ is provided at the second input of mixer 312, and the second mixing signal $V_{mix90(f)}$ is provided at the second input of mixer 316.

Correspondingly, during operation of circuit 400 at block 502, the differential input waves $V_{in, P(f,2f)}$ and $V_{in, M(f,2f)}$, which are representative of and/or derived from the wave $V_{in(f,2f)}$ from the frequency multiplier 122 or 122, are respectively provided at differential input terminals $402_P$ and $402_M$. As shown, the differential input waves $V_{in, P(f,2f)}$ and $V_{in, M(f,2f)}$ includes the fundamental component having the frequency 2f and the subharmonic of the fundamental component, which in this example is a subharmonic component having the frequency f. Each of the differential input waves $V_{in, P(f,2f)}$ and $V_{in, M(f,2f)}$ may also include other subharmonics and harmonics of the fundamental component.

In this example, $V_{in, P(f,2f)}$ and $V_{in, M(f,2f)}$ are provided at first differential inputs of mixer 412 and at first differential inputs of mixer 416. More particularly, $V_{in, P(f,2f)}$ is provided at the respective bases of transistors Q1 and Q4, and $V_{in, M(f,2f)}$ is provided at the respective bases of transistors Q2 and Q3. Similarly, $V_{in, P(f,2f)}$ is provided at the respective bases of transistors Q7 and Q10, and $V_{in, M(f,2f)}$ is provided at the respective bases of transistors Q8 and Q9.

Moreover, differential mixing signals $V_{mix, IP}$ and $V_{mix, IM}$, which are representative of and/or derived from the first mixing signal $V_{mix(f)}$ are provided at second differential inputs of mixer 412. Likewise, differential mixing signals $V_{mix, QP}$ and $V_{mix, QM}$, which are representative of and/or derived from the second mixing signal $V_{mix90(f)}$, are provided at second differential inputs of mixer 416. More particularly, $V_{mix, IP}$ is provided at the base of transistor Q5, and $V_{mix, IM}$ is provided at the base of transistor Q6. Similarly, $V_{mix, QP}$ is provided at the base of transistor Q11, and $V_{mix, QM}$ is provided at the base of transistor Q12. In this example, mixing signals $V_{mix, IP}$, $V_{mix, IM}$, $V_{mix, QP}$, and $V_{mix, QM}$ are sinusoidal signals.

At block 504, the subharmonic detection circuit, e.g., 300 or 400, mixes the input signal with the first mixing signal to generate a first mixed signal and with the second mixing signal to generate a second mixed signal. As mentioned, the second mixing signal is phase-shifted from the first mixing signal. At block 506, the subharmonic detection circuit, e.g., 300 or 400, filters the first mixed signal to provide a first DC signal and filters the second mixed signal to provide a second DC signal. The first and second DC signals indicate presence of the subharmonic.

During operation of circuit 300 at block 504, mixer 312 mixes or combines $V_{mix(f)}$ with $V_{in(f,2f)}$ to generate a first mixed signal at its output, and mixer 316 mixes or combines $V_{mix90(f)}$ with $V_{in(f,2f)}$ to generate a second mixed signal at its output. The first mixed signal includes a first DC component $V_{dc}$ and may include one or more other wave or frequency components. The second mixed signal includes a second DC component $V_{dc90}$ and may include one or more other wave or frequency components. At block 506, filter 314 filters the first mixed signal to provide the first DC component $V_{dc}$ at its output and at the first input of processing circuit 308. Filter 318 filters the second mixed signal to provide the second DC component $V_{dc90}$ at its output and at the second input of processing circuit 308. As such, the filters 314 and 318 attenuate at least some of the wave or frequency components other than the DC components $V_{dc}$ and $V_{dc90}$.

Correspondingly, during operation of circuit 400 at block 504, mixer 412 mixes or combines $V_{mix, IP}$ and $V_{mix, IM}$ with $V_{in, P(f,2f)}$ and $V_{in, M(f,2f)}$, respectively, to generate a first mixed signal at the collective bases of transistors Q1, Q2, Q3, and Q4. The first mixed signal includes the first DC component $V_{dc}$ and may include one or more additional frequency components. Mixer 416 mixes or combines $V_{mix, QP}$ and $V_{mix, QM}$ with $V_{in, P(f,2f)}$ and $V_{in, M(f,2f)}$, respectively, to generate a second mixed signal at the collective bases of transistors Q7, Q8, Q9, and Q10. The second mixed signal includes the second DC component $V_{dc90}$ and may include one or more additional frequency components.

At block 506, filter 414 filters the first mixed signal to provide the first DC component $V_{dc}$ at inputs of DC processing circuit 408, while attenuating at least some of the one or more additional frequency components. Filter 418 filters the second mixed signal to provide the second DC component $V_{dc90}$ at inputs of DC processing circuit 408, while attenuating at least some of the one or more additional frequency components.

At block 508, the subharmonic detection circuit, e.g., 300 or 400, detects the presence of the subharmonic using the first and second DC components, in this example $V_{dc}$ and $V_{dc90}$. For example, the operation of circuit 300 (and similarly circuit 400) can be mathematically modeled using equations (1)-(4), as follows:

$$V\text{in} = A\text{dblr} \cdot \sin(2\omega° t + \theta\text{dblr}) + A\text{sub} \cdot \sin(\omega° t + \theta\text{sub}); \qquad (1)$$

$$V\text{mix} = \sin(\omega° t); \qquad (2)$$

$$V\text{mix90} = -\cos(\omega° t); \text{ and} \qquad (3)$$

$$V\text{det,avg} = 0.5 \cdot A\text{sub\_cos}(\theta\text{sub}) - 0.5 \cdot A\text{sub} \cdot \sin(\theta\text{sub}), \qquad (4)$$

where Vin is the wave from the frequency multiplier 122 or 142 having a fundamental frequency of $2\omega°$ and a subharmonic frequency of $\omega°$; Adblr is the amplitude of the fundamental component; θdblr represents the starting phase of the fundamental component; Asub is the amplitude of the subharmonic component; and θsub represents the starting phase of the subharmonic component.

We can observe from equation (4) that presence of a subharmonic is indicated when Vdet is nonzero, which occurs when Asub is nonzero, and hence when $V_{dc}$ and/or $V_{dc90}$ is nonzero. Thus, presence or absence of a subharmonic can be detected based on values or levels of $V_{dc}$ and $V_{dc90}$, where absence of the subharmonic corresponds to $V_{dc}$ and $V_{dc90}$ both being zero. Accordingly, a subharmonic correction or cancelation circuit can be designed that automatically provides a feedback correction signal that causes $V_{dc}$ and $V_{dc90}$ to go to or toward zero. In an example, the subharmonic cancelation circuit provides a feedback correction signal that causes the subharmonic rejection to meet or exceed a threshold. In one example, the threshold is or corresponds to at least or higher than a 30 dBc subharmonic rejection.

Figure 6:
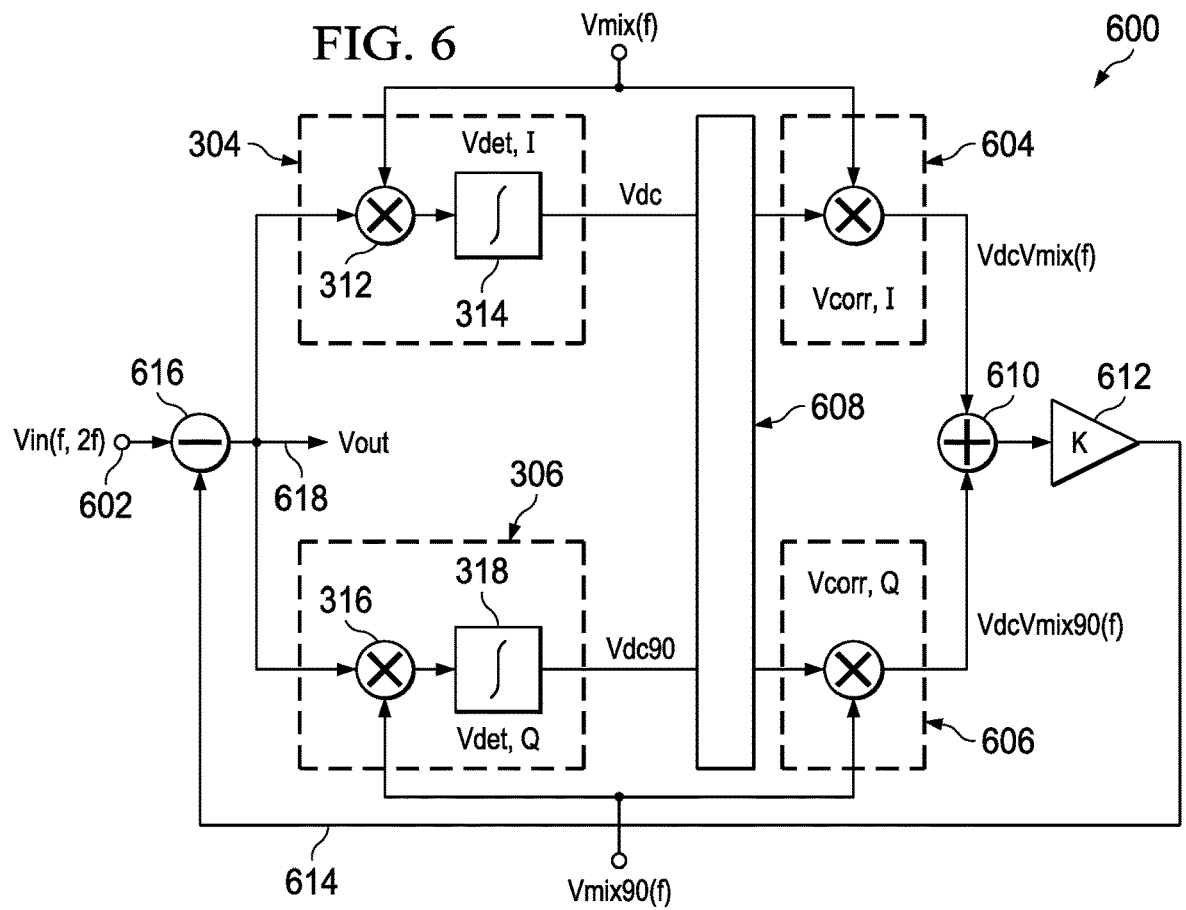
FIG. 6 is a block diagram depicting an example circuit for subharmonic detection and cancellation using sinusoidal mixing signals.

FIG. 6 is a block diagram depicting an example circuit 600 for subharmonic detection and cancelation. As illustrated, circuit 600 includes $V_{det, I}$ 304 (of FIG. 3), $V_{det, Q}$ 306 (of FIG. 3), an in-phase cancelation or correction circuit ($V_{corr, I}$) 604, a quadrature cancelation or correction circuit ($V_{corr, Q}$) 606, a DC processing circuit 608, an adder 610, an adjustment block 612, and a subtractor 616 each having one or more components with one or more inputs and/or outputs and/or interconnections coupled as shown between an input terminal 602 and an output terminal 618 of circuit 600.

In a further example, circuit 600 is included in or coupled to frequency multipliers 122 and 142 of transceiver circuit 100 to detect and cancel subharmonic components in CLK. Accordingly, in transmitter circuitry 102, the input terminal 602 is coupled to the output of frequency multiplier 122. Moreover, the output terminal 618 is coupled to mixer 112. Similarly, in receiver circuitry 104, the input terminal 602 is coupled to the output of frequency multiplier 142. Moreover, the output terminal 618 is coupled to mixer 130.

$V_{det, I}$ 304 and $V_{det, Q}$ 306 are implemented as shown in FIG. 3 and as previously described. $V_{corr, I}$ 604 includes an adjustable I mixer, and is also referred to herein as mixer 604. $V_{corr, Q}$ 606 includes an adjustable Q mixer, and is also referred to herein as mixer 606. In this example, mixers 604 and 606 collectively implement an IQ mixer. As such, the first mixing signal $V_{mix(f)}$ is provided at the second (mixing signal) input of mixer 604, and the second mixing signal $V_{mix90(f)}$ is provided at the second (mixing signal) input of mixer 606.

In an example, DC processing circuit 608 includes one or more digital circuits having one or more logic gates and/or combinational logic circuits to detect the presence of subharmonics using signals at its first and second inputs and provide signals to the mixers 604 and 606 at its first and second outputs. The signals at its first and second outputs adjust one or more parameters of the mixers 604 and 606 to cancel the subharmonic. Alternatively, or additionally, the processing circuit 608 is implemented as a microprocessor, for instance which executes code, to detect the presence of subharmonics using signals at its first and second inputs and provide the signals at its first and second outputs to enable and facilitate the subharmonic cancelation.

Adjustment block 612 represents collective adjusted parameters, K, of the mixers 604 and 606. Adder 610 can be implemented as or represented by any suitable adder, for example as interconnections of signal lines from the mixers 604 and 606. Subtractor 616 can be implemented as or represented by any suitable subtractor, for example as interconnections of signal lines from the mixers 604 and 606 with the input terminal 602.

As further shown in FIG. 6, the input terminal 602 is coupled to a first (frequency multiplier) input of the subtractor 616. The output of the subtractor 616 is coupled to the output terminal 618, to the first input of mixer 312, and to the first input of mixer 316. The output of mixer 312 is coupled to the input of filter 314. The output of filter 314 is coupled to the first input of DC processing circuit 608. The output of mixer 316 is coupled to the input of filter 318. The output of filter 318 is coupled to the second input of DC processing circuit 608. The first output of DC processing circuit 608 is coupled to the first input of mixer 604. The second output of DC processing circuit 608 is coupled to the first input of mixer 606. The output of mixer 604 is coupled to the first input of adder 610, and the output of mixer 606 is coupled to the second input of adder 610. The output of adder 610 is coupled to the second (feedback) input of subtractor 616 via a feedback line 614.

Figure 7:
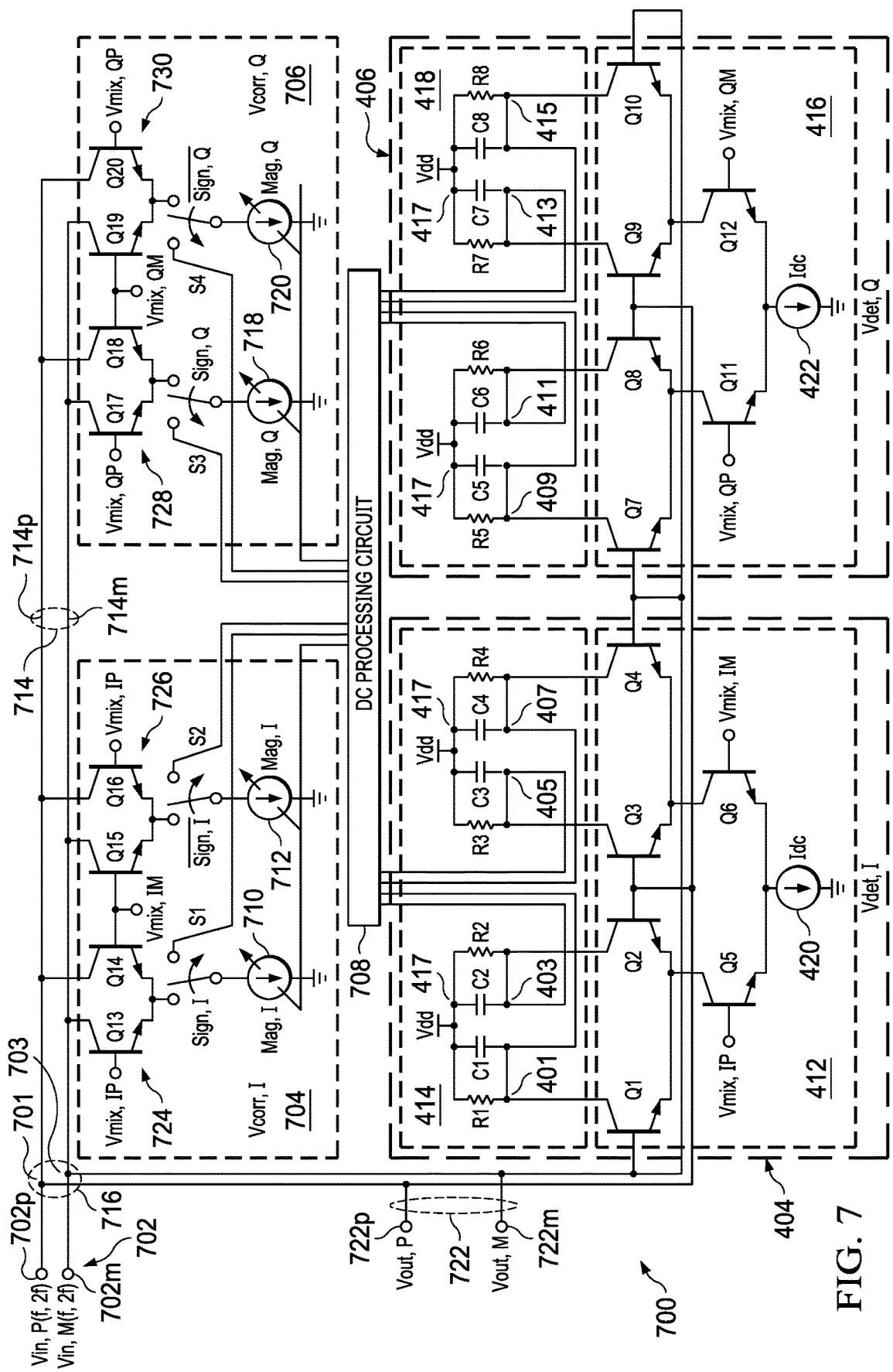
FIG. 7 is a schematic circuit diagram depicting an example circuit for subharmonic detection and cancelation that implements the circuit shown in FIG. 6.

FIG. 7 is a schematic circuit diagram depicting an example circuit 700 for subharmonic detection and cancelation that implements the circuit shown in FIG. 6. As illustrated, circuit 700 includes $V_{det, I}$ 404 (of FIG. 4), $V_{det, Q}$ 406 (of FIG. 4), an in-phase cancelation or correction circuit ($V_{corr, I}$) 704, a quadrature cancelation or correction circuit ($V_{corr, Q}$) 706, and a DC processing circuit 708, each having one or more components with one or more inputs and/or outputs and/or interconnections coupled as shown between differential input terminals 702$_P$ and 702$_M$ (collectively referred to as differential input terminals 702) and differential output terminals 722$_P$ and 722$_M$ (collectively referred to as differential output terminals 722) of circuit 700. In this example, $V_{det, I}$ 404 and $V_{det, Q}$ 406 are implemented as shown in FIG. 4 and as previously described. $V_{corr, I}$ 704 is an implementation of $V_{corr, I}$ 604. $V_{corr, Q}$ 706 is an implementation of $V_{corr, Q}$ 606, and DC processing circuit 708 is an implementation of processing circuit 608. Moreover, in this example, circuit 700 is implemented as a differential circuit but need not be.

In a further example, circuit 700 is included in or coupled to frequency multipliers 122 and 142 of transceiver circuit 100 to detect and cancel subharmonic components in CLK. In the example transmitter circuitry 102, differential input terminals 702 are coupled to the output of frequency multiplier 122. Moreover, differential output terminals 722 are coupled to mixer 112. Similarly, in the example receiver circuitry 104, differential input terminals 702 are coupled to the output of frequency multiplier 142. Moreover, differential output terminals 722 are coupled to mixer 130.

As further shown in FIG. 7, $V_{corr, I}$ 704 includes I mixers 724 and 726, and $V_{corr, Q}$ 706 includes Q mixers 728 and 730. Mixer 724 includes transistors Q13 and Q14, switch S1, and a variable current source 710, which generates a current having a variable magnitude of Mag,I and a polarity of Sign, I. Mixer 726 includes transistors Q15 and Q16, switch S2, and a variable current source 712, which generates a current having a variable magnitude of Mag,I and a polarity of $\overline{Sign,I}$. Mixer 728 includes transistors Q17 and Q18, switch S3, and a variable current source 718, which generates a current having a variable magnitude of Mag,Q and a polarity of Sign, Q. Mixer 730 includes transistors Q19 and Q20, switch S4, and a variable current source 720, which generates a current having a variable magnitude of Mag,Q and a polarity of $\overline{SignQ}$. In an example, the couplings between the outputs of the DC processing circuit 708 and components of circuits 704 and 706 collectively implement adjustment block 612 of FIG. 6. Correspondingly, the DC processing circuit 708 providing signals at its outputs to select Sign, I, $\overline{Sign,I}$, Sign, Q, and/or $\overline{SignQ}$, and to vary Mag,I and Mag,Q collectively represents variable K for a given time period.

Transistors Q13-Q20 are illustrated as NPN BJTs. However, in other examples, one or more of transistors Q13-Q20 may be a PNP BJT or a FET such as a MOSFET. Moreover, switches S1, S2, S3, and S4 may be implemented as transistors, such as BJTs or MOSFETs.

Also shown, nodes 401, 403, 405, and 407 are coupled to respective inputs of DC processing circuit 708 to enable processing circuit 708 to receive $V_{dc}$. Nodes 409, 411, 413, and 415 are also coupled to respective inputs of DC processing circuit 708 to enable processing circuit 708 to receive $V_{dc90}$.

As shown with respect to $V_{corr, I}$ 704, a first output of DC processing circuit 708 is coupled to a control terminal of switch S1 to control the opening and closing of switch S1 responsive to the value or level of $V_{dc}$. A second output of DC processing circuit 708 is coupled to a control terminal of switch S2 to control the opening and closing of switch S2 responsive to the value or level of $V_{dc}$. A third output of DC processing circuit 708 is coupled to respective inputs of current sources 710 and 712 to adjust Mag, I responsive to the value or level of $V_{dc}$. In an example, only one of the switches S1 or S2 is closed during a time period depending on the polarity (positive or negative) of the current needed to generate feedback correction signals on differential feedback lines $714_P$ and $714_M$, collectively referred to as feedback lines 714. Feedback lines 714 implement adder 610 and feedback line 614 of FIG. 6.

Moreover, the current source 710 has a first terminal coupled to a first terminal of switch S1 and a second terminal coupled to electrical ground. A second terminal of switch S1 is coupled to respective emitters of transistors Q13 and Q14. The collector of transistor Q13 is coupled to feedback line $714_M$, and the collector of transistor Q14 is coupled to feedback line $714_P$. Similarly, the current source 712 has a first terminal coupled to a first terminal of switch S2 and a second terminal coupled to electrical ground. A second terminal of switch S2 is coupled to respective emitters of transistors Q15 and Q16. The collector of transistor Q15 is coupled to feedback line $714_M$, and the collector of transistor Q16 is coupled to feedback line $714_P$.

As shown with respect to $V_{corr, Q}$ 706, a fourth output of DC processing circuit 708 is coupled to a control terminal of switch S3 to control the opening and closing of switch S3 responsive to the value or level of $V_{dc90}$. A fifth output of DC processing circuit 708 is coupled to a control terminal of switch S4 to control the opening and closing of switch S4 responsive to the value or level of $V_{dc90}$. A sixth output of DC processing circuit 708 is coupled to respective inputs of current sources 718 and 720 to adjust Mag, Q responsive to the value or level of $V_{dc90}$. In this example, only one of the switches S3 or S4 is closed during a time period depending on the polarity (positive or negative) of the current needed to generate the feedback correction signals on differential feedback lines $714_P$ and $714_M$.

Moreover, the current source 718 has a first terminal coupled to a first terminal of switch S3 and a second terminal coupled to electrical ground. A second terminal of switch S3 is coupled to respective emitters of transistors Q17 and Q18. The collector of transistor Q17 is coupled to feedback line $714_M$, and the collector of transistor Q18 is coupled to feedback line $714_P$. Similarly, the current source 720 has a first terminal coupled to a first terminal of switch S4 and a second terminal coupled to electrical ground. A second terminal of switch S4 is coupled to respective emitters of transistors Q19 and Q20. The collector of transistor Q19 is coupled to feedback line $714_M$, and the collector of transistor Q20 is coupled to feedback line $714_P$. Also, the bases of transistors Q14 and Q15 are coupled together, and the bases of transistors Q18 and Q19 are coupled together.

A constructive "subtractor" 716 implements the subtractor 616 of FIG. 6 and includes an intersection of input terminal $702_P$ with feedback line $714_P$ at a node 701 and an intersection of input terminal $702_M$ with feedback line $714_M$ at a node 703. Output terminal $722_P$ is coupled to a first output of the subtractor 716 at node 701, and output terminal $722_M$ is coupled to a second output of the subtractor 716 at node 703. Additionally, the bases of transistors Q1, Q4, Q7, and Q10 are coupled to the first output of the subtractor 716 at node 701, and the bases of transistors Q2, Q3, Q8 and Q9 are coupled to the second output of the subtractor 716 at node 703.

Figure 8:
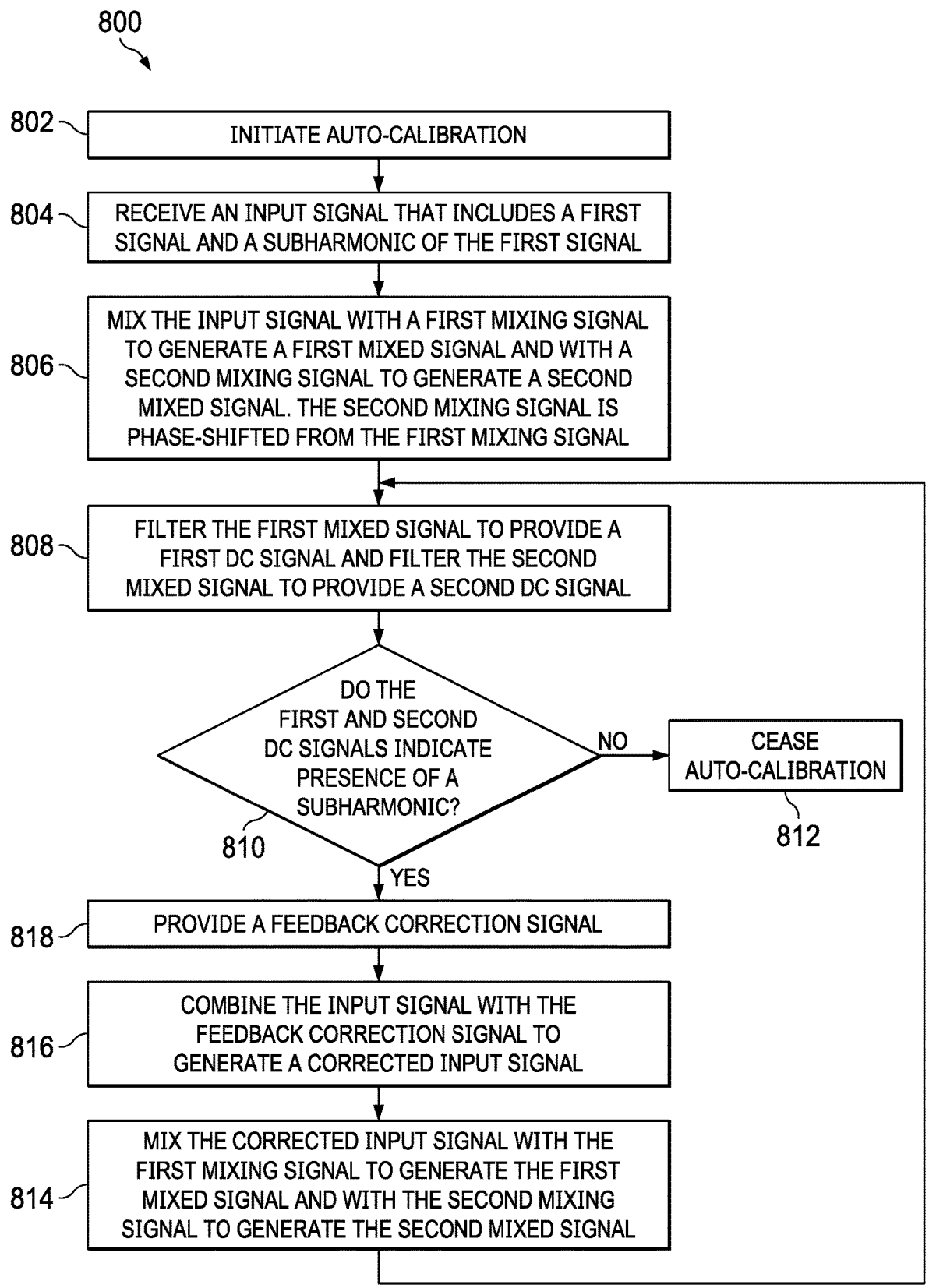
FIG. 8 is a flow diagram depicting an example method for subharmonic detection and cancelation.

FIG. 8 is a flow diagram depicting an example method 800 for subharmonic detection and cancelation. Method 800 may be performed while operating circuit 600 or circuit 700. In one example, method 800 begins at block 802 with an auto-calibration sequence being initiated for subharmonic cancelation. The auto-calibration sequence implemented by performing method 800 may be performed at any suitable point in time such as when the device is turned on, when the frequency needed for transmission or reception in the transceiver circuit 100 changes, when a change in an environmental condition is detected (e.g., ambient temperature has changed more than a threshold amount), based on a standard, etc. Alternatively, method 800 is initiated manually, for instance using a button on a device that includes transceiver circuit 100.

In an example, circuits 600 and 700 perform block 804 in a manner similarly to that described with respect to circuits 300 and 400 performing block 502, with some additional functionality. Namely, in circuit 600 the first mixing signal $V_{mix(f)}$ is provided at an input of mixer 604, and the second mixing signal $V_{mix90(f)}$ is provided at an input of mixer 606. In circuit 700, the differential mixing signals $V_{mix, IP}$ and $V_{mix, IM}$ are provided at differential inputs of mixers 724 and 726. Likewise, differential mixing signals $V_{mix, QP}$ and $V_{mix, QM}$ are provided at differential inputs of mixers 728 and 730. More particularly, $V_{mix, IP}$ is provided at the respective bases of transistors Q13 and Q16, and $V_{mix, IM}$ is provided at the respective bases of transistors Q14 and Q15. Similarly, $V_{mix,QP}$ is provided at the respective bases of transistors Q17 and Q20, and $V_{mix, QM}$ is provided at the respective bases of transistors Q18 and Q19.

Further to this example, circuits 600 and 700 perform block 806 in a manner similarly to that described with respect to circuits 300 and 400 performing block 504. Moreover, circuits 600 and 700 perform block 808 in a manner similarly to that described with respect to circuits 300 and 400 performing block 506.

At block 810, circuit 600 or 700 determines whether the first and second DC components, in this example $V_{dc}$ and $V_{dc90}$, indicate the presence of the subharmonic. If the presence of the subharmonic is not detected, the method 800 proceeds to block 812, where circuit 600 or 700 ceases or discontinues the auto-calibration sequence. If the presence of the subharmonic is detected, the method 800 proceeds to block 818, where circuit 600 or 700 provides a feedback correction signal.

In one example, DC processing circuit 608 or 708 determines at block 810 whether both the respective values or levels of $V_{dc}$ and $V_{dc90}$ are zero or substantially zero, for instance within a margin dictated by limitations of the hardware of transceiver circuit 100 or some other acceptable margin of error. If both of the respective values or levels of $V_{dc}$ and $V_{dc90}$ are zero or substantially zero, transceiver 100 (e.g., via a microprocessor or controller managing the auto-calibration sequence and upon notification by DC processing circuit 608 or 708) discontinues the auto-calibration sequence, at block 812. For example, at block 812, DC processing block 608 or 708 causes the last values of Sign, I, $\overline{\text{Sign,I}}$, $\overline{\text{Sign,Q}}$, Sign Q, Mag,I, and Mag,Q to be retained. Otherwise, if one or both of the respective values or levels of $V_{dc}$ and $V_{dc90}$ exceed zero, DC processing circuit 608 provides a feedback correction signal or signals on feedback line 614, at block 818. Likewise, if one or both of the respective values or levels of $V_{dc}$ and $V_{dc90}$ exceed zero, DC processing circuit 708 provides a feedback correction signal or signals on feedback lines 714, at block 818.

In another example, DC processing circuit 608 or 708 determines at block 810 whether both of the respective values or levels of $V_{dc}$ and $V_{dc90}$ are less than or within a threshold, for instance less than a threshold value or level that would cause the subharmonic rejection to exceed 30 dBc, in one example. If both the respective values or levels of $V_{dc}$ and $V_{dc90}$ are less than the threshold value or level, transceiver 100 discontinues the auto-calibration sequence, at block 812. Otherwise, if one or both of the respective values or levels of $V_{dc}$ and $V_{dc90}$ exceed the threshold value or level, DC processing circuit 608 provides the feedback correction signal or signals on feedback line 614, at block 818. Likewise, if one or both of the respective values or levels of $V_{dc}$ and $V_{dc90}$ exceed the threshold value or level, DC processing circuit 708 provides the feedback correction signal or signals on feedback lines 714, at block 818.

In an example, at block 818 and responsive to detecting the subharmonic, DC processing circuit 608 determines and provides adjustment signals to mixers 604 and 606, as indicated by adjustment block 612. Responsive thereto, the mixers 604 and 606 adjust their respective output signals which, when combined by adder 610, serve as the feedback correction signal provided on feedback line 614. As shown, the adjusted output signal from mixer 604 is indicated as $V_{dc}V_{mix(f)}$, and the adjusted output signal from mixer 604 is indicated as $V_{dc}V_{mix90(f)}$.

Similarly, at block 818 and responsive to detecting the subharmonic, DC processing circuit 708 determines and provides adjustment signals to mixers 704 and 706 to adjust current source parameters. Namely, for mixer 704, DC processing circuit 708 provides signals on its first, second, and third outputs that: closes one of the switches S1 or S2 while the other switch remains or is opened; and sets or adjusts Mag, I, which sets the magnitude and polarity of the respective current source 710 or 712 coupled the closed switch. Additionally, DC processing circuit 708 provides signals on its fourth, fifth, and sixth outputs that: closes one of the switches S3 or S4 while the other switch remains or is opened; and sets or adjusts Mag, Q, which sets the magnitude and polarity of the respective current source 718 or 720 coupled the closed switch. Responsive to the adjusted parameters of mixers 704 and 706 a collective amount of current (which is the feedback correction signal in this example) is sourced or sinked to feedback lines 714.

In an example, the DC processing circuit 608 or 708 implements logic or executes code representing mathematical equations to determine the one or more adjustment signals, which are represented by the variable K. In this example, the operation of circuit 600 (and similarly circuit 700) can be mathematically modeled using equations (1)-(3) and additional equations (5)-(9), as follows:

$$V_{dc} \approx A\text{sub} \cdot \cos(\theta\text{sub})/K; \quad (5)$$

$$V_{dc90} \approx A\text{sub} \cdot \sin(\theta\text{sub})/K; \quad (6)$$

$$V\text{mix90}=-\cos(\omega°t); \quad (7)$$

$$V\text{out}=V\text{in}-K[V\text{dc} \sin(\omega°t)]+K[V\text{dc90} \cdot \cos(\omega°t)]; \text{ and} \quad (8)$$

$$V\text{out}=A\text{dblr} \cdot \sin(2\omega°t+\theta\text{dblr})+\alpha A\text{sub} \cdot \sin(\omega°t+\theta\text{sub})$$
$$\text{where } \alpha \to 0, \quad (9)$$

where Vin is the wave from the frequency multiplier 122 or 142 having a fundamental frequency of $2\omega°$ and a subharmonic frequency of $\omega°$; Vout is the wave at the output terminal 618 of circuit 600 or the wave at the differential output terminals 722 of circuit 700; Adblr is the amplitude of the fundamental component; θdblr represents the starting phase of the fundamental component; Asub is the amplitude of the subharmonic component; θsub represents the starting phase of the subharmonic component; K is a variable; and a represents a factor by which Asub is reduced using circuit 600 or 700.

In this example, DC processing circuit 608 or 708 solves for a value K that would cause both $V_{dc}$ and $V_{dc90}$ to move or converge toward zero or the threshold value. The DC processing circuit 608 provides one or more adjustment signals to mixers 604 and 606 responsive to the determined value of K, and DC processing circuit 708 provides one or more adjustment signals to mixers 704 and 706 responsive to the determined value of K. The one or more adjustment signals may correlate to one or more values in a stored table, for instance.

At block 816, the circuit 600 or 700 combines the input signal with the feedback correction signal to generate a corrected input signal. In circuit 600, the feedback correction signal is subtracted from the input signal $V_{in(f,2f)}$ by the subtractor 616. The corrected input signal is provided at the output of the subtractor 616 to output terminal 618 and to the respective first inputs of mixers 312 and 316. In circuit 700, the feedback correction signal is subtracted from the differential input signals $V_{in, P(f,2f)}$ and $V_{in, M(f,2f)}$ at nodes 701 and 703. The corrected input signal is provided at signal lines out of the nodes 701 and 703 to differential output terminals 722 and to the respective first differential inputs of mixers 412 and 416.

At block 814, the corrected input signal is mixed with the first mixing signal to generate the first mixed signal and with the second mixing signal to generate the second mixed signal. For example, circuits 600 and 700 perform block 814 in a manner similarly to that described with respect to circuits 300 and 400 performing block 504. The method 800 then returns to block 808 where the loop including blocks 808, 810, 818, 816, and 814 is performed until circuit 600 or 700 does not detect the presence of the subharmonic, at which time the method ends at block 812.

Example benefits of circuits 600 and 700 include: using lesser die area than the frequency domain filtering approach; and the autocorrection of the subharmonic, which can be maintained across PVT. However, the circuits 600 and 700 are sensitive to phase and amplitude errors between the first and second mixing signals $V_{mix(f)}$ and $V_{mix90(f)}$. If the phase or amplitude error is too high, no value of K will cause both $V_{dc}$ and $V_{dc90}$ to move or converge toward zero or the threshold value. This may lead to an inadequate subharmonic cancellation at any value of K.

Figure 9:
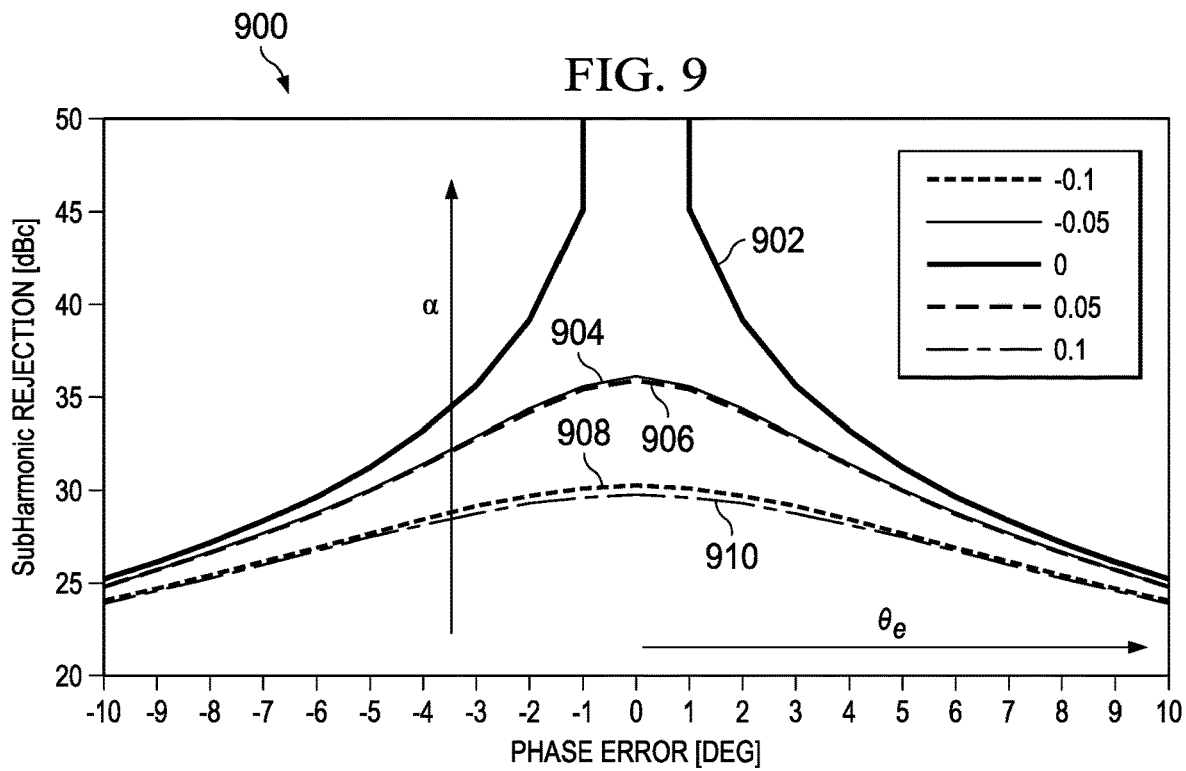
FIG. 9 is a graph diagram illustrating the impact of phase and amplitude errors on subharmonic rejection when operating the circuits depicted in FIGS. 6 and 7.

FIG. 9 is a graph diagram 900 illustrating an example impact of a phase error (θe) and/or an amplitude error (α) on subharmonic rejection when operating the circuits depicted in FIGS. 6 and 7. Diagram 900 depicts curves 902, 904, 906, 908, and 910 plotting subharmonic rejection (in dBc) against phase error (in degrees) for different amplitude errors. For curve 902, α=0. For curve 904, α=-05. For curve 906, α=0.5. For curve 908, α=-0.1. For curve 910, α=0.01. Diagram 900 illustrates that circuits 600 and 700 provide subharmonic rejection that exceeds 30 dBc for -0.05<α<0.05 and -5<θe<5.

Figure 10:
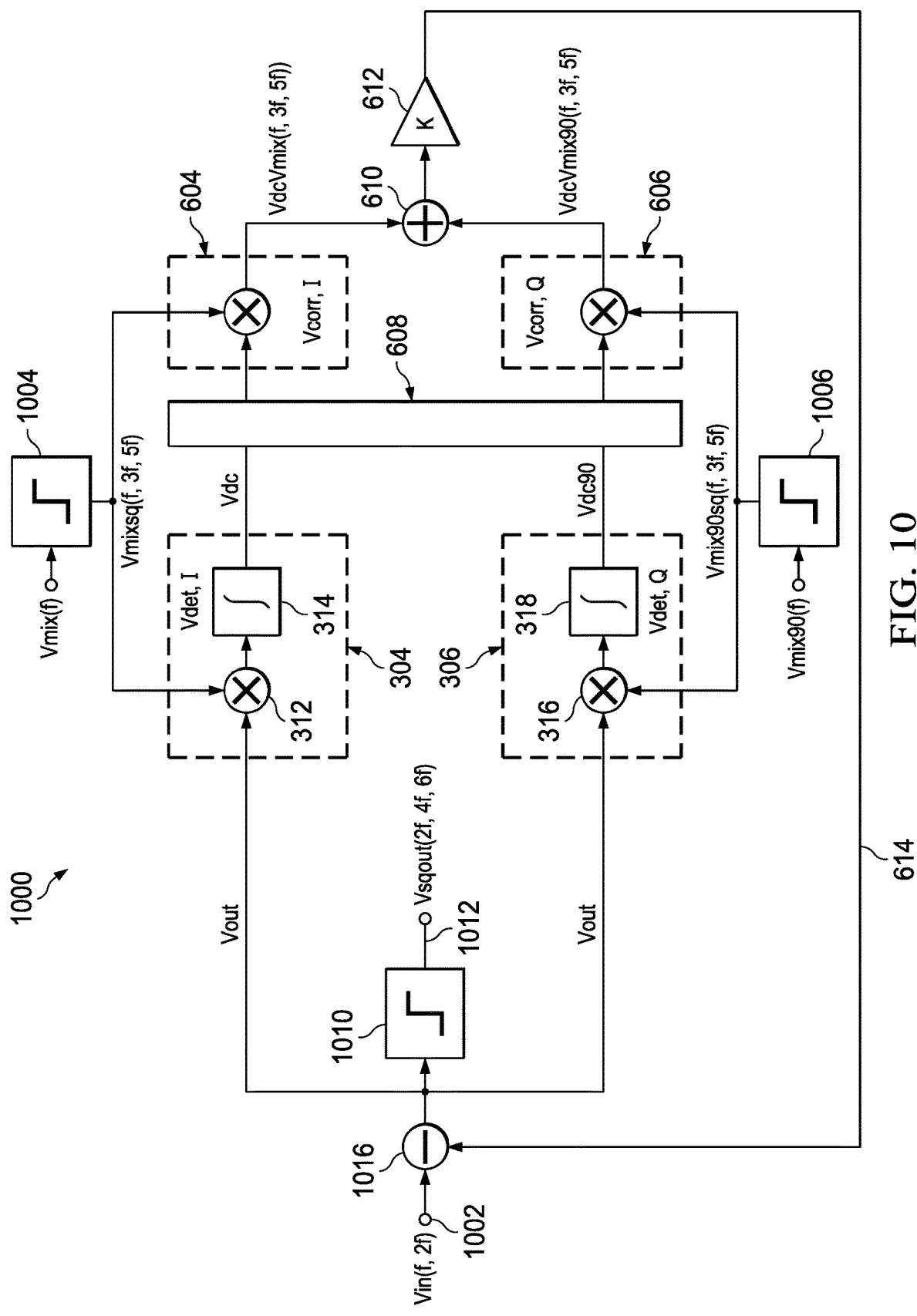
FIG. 10 is a block diagram depicting another example circuit for subharmonic detection and cancelation using square wave mixing signals.

FIG. 10 is a block diagram depicting another example circuit 1000 for subharmonic detection and cancelation. Circuit 1000 addresses limitations of circuits 600 and 700, as circuit 1000 is less sensitive to both a phase error and an amplitude error. As illustrated, circuit 1000 includes: $V_{det, I}$ 304 and $V_{det, Q}$ 306 (implemented as shown in FIG. 3 and previously described); $V_{corr, I}$ 604, $V_{corr, Q}$ 606, DC processing circuit 608, adder 610, and adjustment block 612 (implemented as shown in FIG. 6 and previously described); a subtractor 1016; and limiter circuits 1004, 1006, and 1010, each having one or more components with one or more inputs and/or outputs and/or interconnections coupled as shown between an input terminal 1002 and an output terminal 1012 of circuit 1000.

In a further example, circuit 1000 is included in or coupled to frequency multipliers 122 and 142 of transceiver circuit 100 to detect and cancel subharmonic components in CLK. Accordingly, in transmitter circuitry 102, the input terminal 1002 is coupled to the output of frequency multiplier 122. Moreover, the output terminal 1012 is coupled to mixer 112. Similarly, in receiver circuitry 104, the input terminal 1002 is coupled to the output of frequency multiplier 142. Moreover, the output terminal 1012 is coupled to mixer 130.

In one example, limiter circuits 1004, 1006, and 1010 are hard-limiters which convert an input sinusoidal wave to a substantially output square wave. As such, hard-limiters 1004, 1006, and 1010 maintain the zero-crossing of the input sinusoidal wave. Moreover, for time-varying amplitudes of the input sinusoidal wave above its DC value, the amplitude of the output square wave is hard limited to a maximum value, e.g., Amax. Likewise, for time-varying amplitudes of the input sinusoidal wave below its DC value, the amplitude of the output square wave is hard limited to a minimum value, e.g., Amin. Accordingly, Amax and Amin correspond to hard-limited two level (maximum and minimum) of a square wave. Further to this example, subtractor 1016 may be implemented as a suitable subtractor circuit, including a circuit performing current subtraction.

As further shown in FIG. 10, the first (frequency multiplier) input of subtractor 1016 is coupled to input terminal 1002. The second (feedback) input of the subtractor 1016 is coupled to the feedback line 614. The output of subtractor 1016 is coupled to an input of hard-limiter 1010, to the first input of mixer 312, and to the first input of mixer 316. Accordingly, mixers 312 and 316 receive a corrected wave ($V_{out}$) out from the subtractor 1016. An output of hard-limiter 1010 is coupled to or includes the output terminal 1012. Accordingly, the output clock wave ($V_{out\_sq\ (2f,\ 4f,\ 6f)}$) is a square wave instead of a sinusoidal wave. Also, the hard-limiter 1010 at the output removes at least some of the distortion the subtractor 1016 may cause. An output of hard-limiter 1004 is coupled to the second input of mixer 312 and to the input of mixer 604. Accordingly, these mixers receive a square ($V_{mix\_sq\ (f,\ 3f,\ 5f)}$) of the first mixing signal. Likewise, output of hard-limiter 1006 is coupled to the second input of mixer 316 and to the input of mixer 606. Accordingly, these mixers receive a square ($V_{mix90\_sq\ (f,\ 3f,\ 5f)}$) of the second mixing signal.

Figure 11:
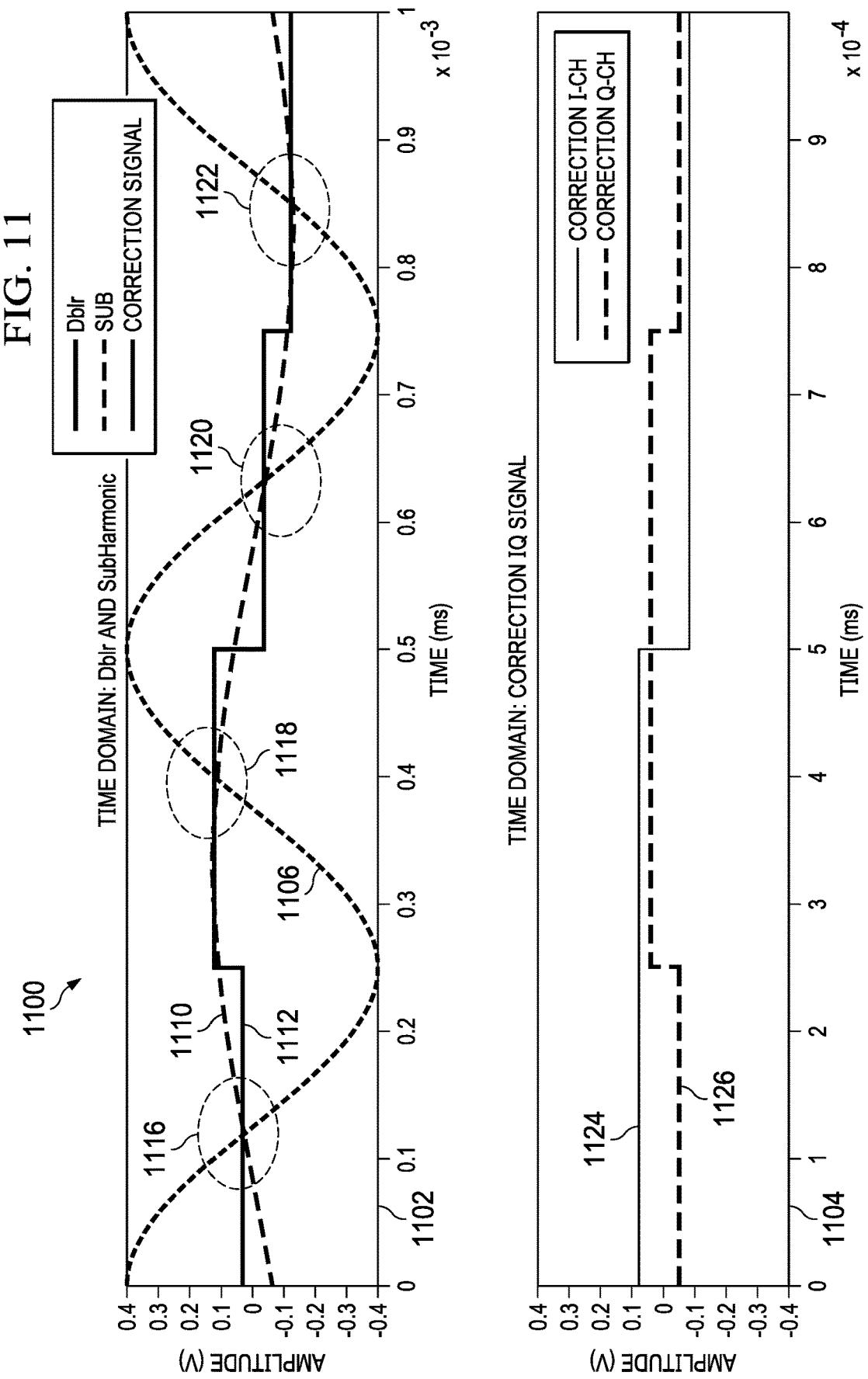
FIG. 11 is a graph diagram depicting example waves that illustrate subharmonic cancelation when operating the circuit shown in FIG. 10.

FIG. 11 is a graph diagram 1100 depicting example waves that illustrate subharmonic cancelation in the time domain when operating the circuit 1000 shown in FIG. 10. Illustrated is a graph 1102 and a graph 1104, each including plots of amplitude (in V) versus time (in mS) and representing various waves. Graph 1102 includes plots 1106, 1110, and 1112. Graph 1104 includes plots 1124 and 1126.

Plot 1106 represents a fundamental component out of a multiplier, e.g., multiplier 122 or 142 of transceiver circuit 100, which doubles the frequency of a source signal, e.g., from f to 2f. Plot 1110 represents a subharmonic component, which is a subharmonic of the fundamental component, at the frequency f. Plot 1112 represents a correcting signal (e.g., the feedback correcting signal) used to cancel the subharmonic. Using circuit 1000, for instance, correction can be applied at amplitude intersections 1116, 1118, 1120, and 1122 of the subharmonic component and fundamental component. This correlates to a zero crossing adjustment of the clock signal which is corrupted with the subharmonic.

At these intersections, a respective DC level of the correction signal is applied that has the same amplitude as the subharmonic component but has an opposite polarity. More particularly, a first level of the correction signal is applied at intersection 1116. A second level of the correction signal is applied at intersection 1118. A third level of the correction signal is applied at intersection 1120, and a fourth level of the correction signal is applied at intersection 1122. In this example, the correcting signal represents the sum of a correcting I square wave (I-CH) represented by plot 1124 and a correcting Q square wave (Q-CH) represented by plot 1126.

Due to the correcting signal being the sum of hard-limited I and Q waves, and correction being needed only at zero crossings (rather than exact cancellation at all points), the circuit 1000 can perform subharmonic cancelation amidst much larger IQ mismatches than circuits that perform cancelation using sinusoidal waves. Also, the hard-limited I and Q waves are less prone to amplitude mismatch than the sinusoidal I and Q waves.

Figure 12:
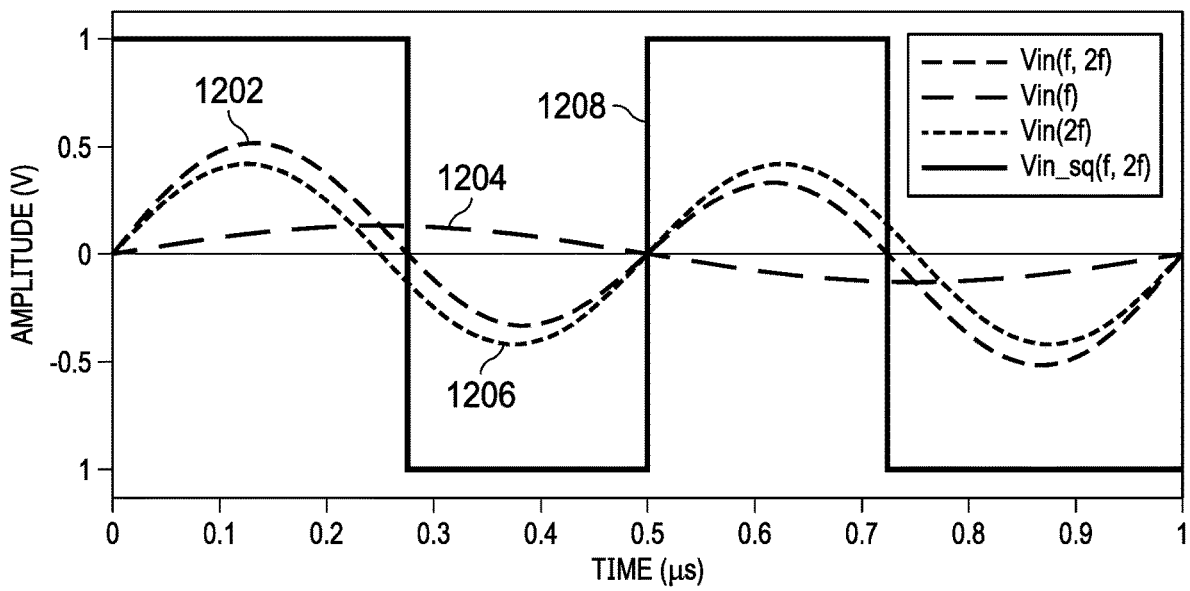
FIG. 12 is a graph diagram depicting example waves that illustrate subharmonic cancelation when operating the circuit shown in FIG. 10.

FIG. 12 is a graph diagram 1200 depicting example waves that illustrate subharmonic cancelation when operating the circuit shown in FIG. 10. Graph diagram 1200 includes plots 1202, 1204, 1206, and 1208 of amplitude (in V) versus time (in microseconds (µS)) and representing various waves. Plot 1206 represents the ideal wave, $V_{in(2f)}$, from the frequency multiplier 122 or 142. Plot 1204 represents the subharmonic component, $V_{in(f)}$, generated by the frequency multiplier 122 or 142. Plot 1202 represents, $V_{in(f,\ 2f)}$, the ideal wave corrupted or distorted by the subharmonic component, and plot 1208 represents the square of or hard-limited $V_{in(f,\ 2f)}$. As can be seen in plots 1202 and 1206, not only does the zero crossing of corrupted sinusoidal wave $V_{in(f,\ 2f)}$ lag the zero crossing of the ideal sinusoidal wave $V_{in(2f)}$, there are also amplitude mismatches along many points of the two sinusoidal waves, which would need to be corrected. However, plot 1208 illustrates that if both waves 1202 and 1206 were hard-limited to have the same or substantially the same amplitude, the corrupted wave $V_{in(f,\ 2f)}$ could be corrected simply by shifting its zero crossing to that of the ideal wave $V_{in(2f)}$.

Figure 13:
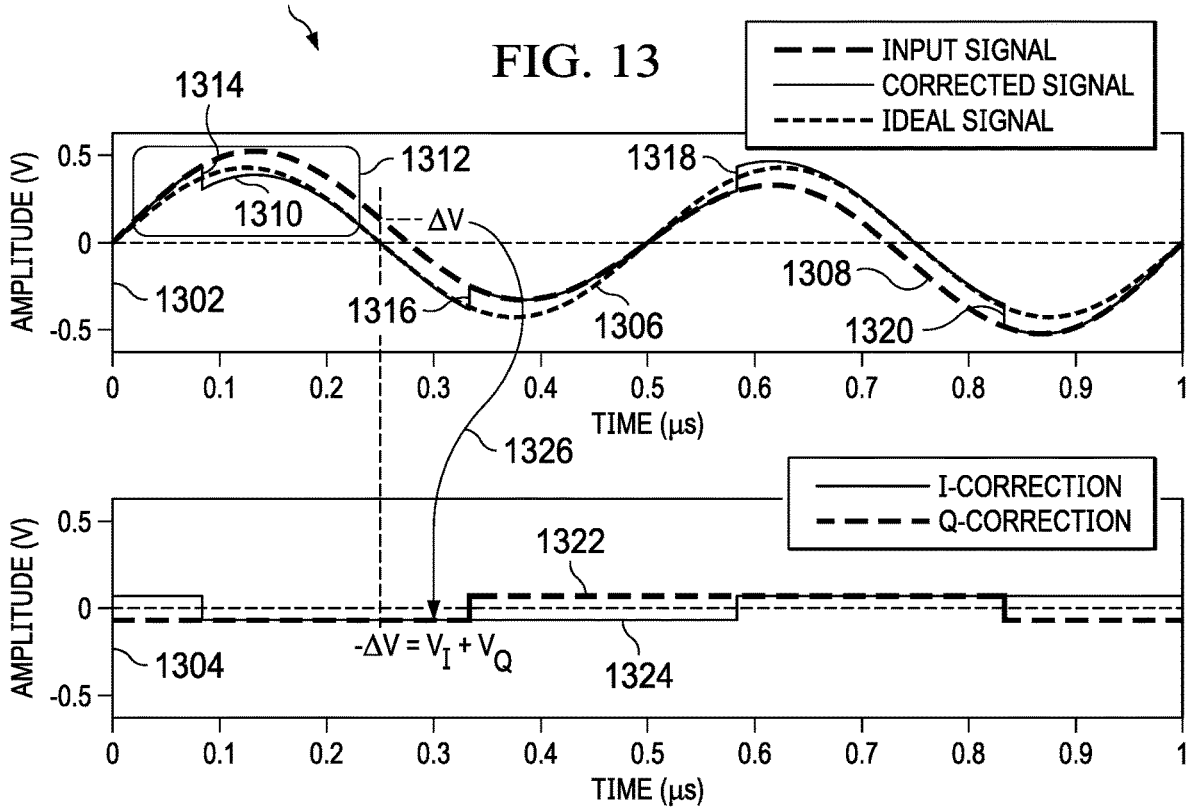
FIG. 13 is a graph diagram depicting example waves that illustrate subharmonic cancelation when operating the circuit shown in FIG. 10.

FIG. 13 is a graph diagram 1300 depicting example waves that illustrate subharmonic cancelation when operating the circuit shown in FIG. 10. Illustrated is a graph 1302 and a graph 1304, each including plots of amplitude (in V) versus time (in µS) and representing various waves. Graph 1302 includes plots 1306, 1308, and 1310. Graph 1304 includes plots 1322 and 1324.

Plot 1306 represents the ideal wave, $V_{in(2f)}$, from the frequency multiplier 122 or 142 of transceiver circuit 100. Plot 1308 represents, $V_{in(f,\ 2f)}$, the ideal wave corrupted or distorted by the subharmonic component from the frequency multiplier 122 or 142. Plot 1310 represents the corrected signal having subharmonic cancelation. Plot 1322 represents the correcting I square wave, and plot 1324 represents the correcting Q square wave.

In this example, the corrupted wave and the ideal wave have a maximum amplitude difference (ΔV). Accordingly, a correction level of −ΔV=Vi+Vq (indicated at 1326) can be applied to correct ΔV. Using circuit 1000, for instance, correction can be applied anywhere within a window 1312 to realign the corrupted wave with the ideal wave, which enables a large acceptable mismatch of the correcting I and Q signals. As shown the correction level is applied at 1314, where the correcting I square wave transitions from high to low. Moreover, correction can be automatically applied anytime there is a transition of the correcting I square wave or the correcting Q square wave, as indicated at 1316, 1318, and 1320.

Figure 14:
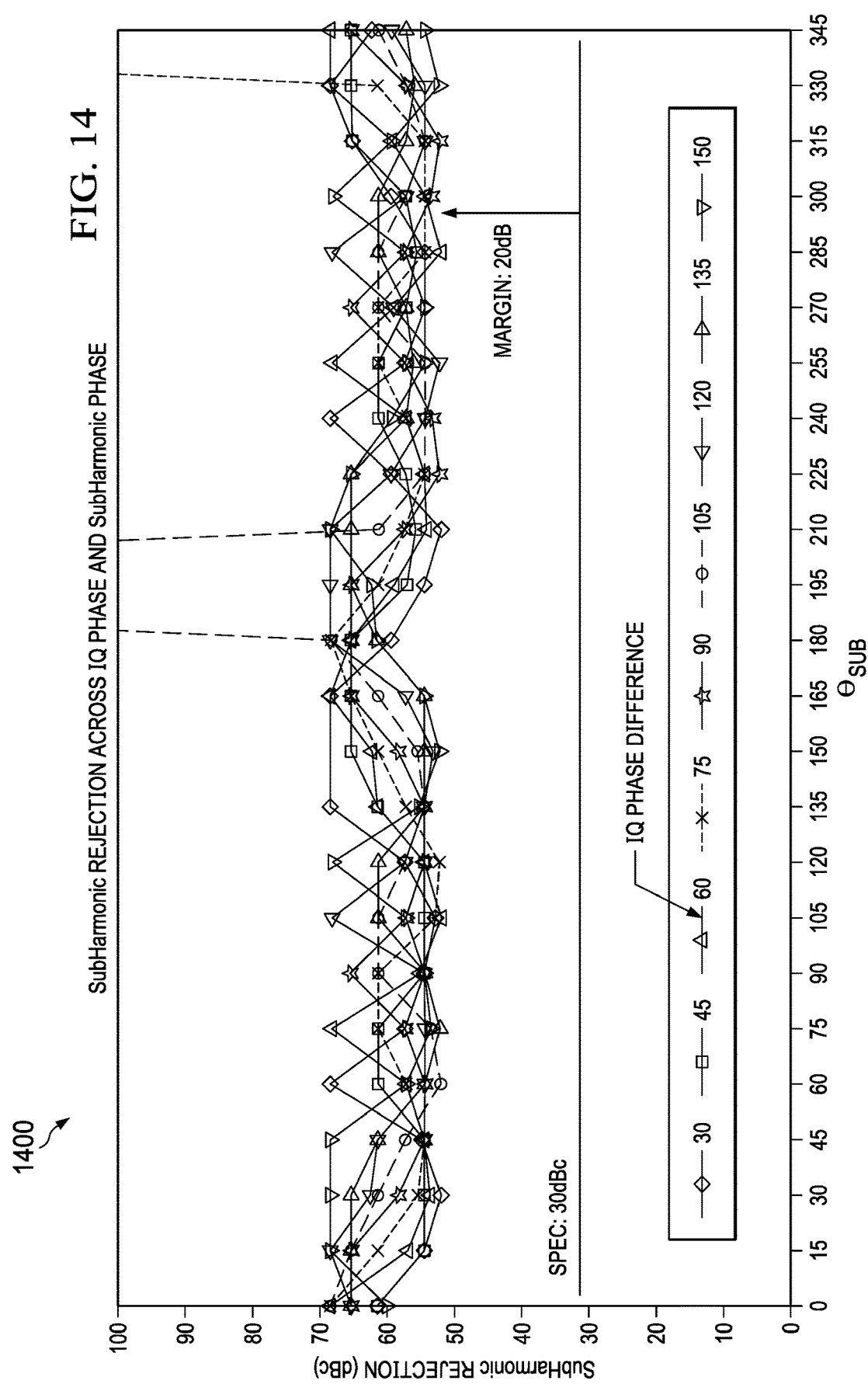
FIG. 14 is a graph diagram illustrating example subharmonic rejection when operating the circuit shown in FIG. 10.

FIG. 14 is a graph diagram 1400 illustrating example subharmonic rejection when operating the circuit shown in FIG. 10. Plots of subharmonic rejection (in dBc) versus subharmonic phase ($\theta_{sub}$) for various IQ phase differences of the mixing signals, for instance at the outputs of hard-limiters 1004 and 1006. Ideally, the mixing signals have a 90 degree phase difference. However, as illustrated, even where the phase difference of the mixing signals is greater or less than 90 degrees, subharmonic rejection exceeds 50 dBc (which is at least 20 dBc above a 30 dBc specification) across all the IQ phase differences illustrated. Thus, circuit 1000 provides robust subharmonic cancelation irrespective of IQ phase differences between the mixing signals at the outputs of hard-limiters 1004 and 1006.

FIG. 15 is a graph diagram 1500 illustrating example subharmonic rejection when operating the circuit shown in FIG. 10. Graph diagram 1500 includes a bar graph 1502 and a bar graph 1504. Bar graph 1502 depicts the spectrum of the output clock signal before calibration (e.g., $V_{in}$ into the calibration loop from frequency multiplier 122 or 142), and bar graph 1504 depicts the spectrum of the output clock signal after calibration and passing through a hard-limiter (e.g., 1010), for instance using circuit 1000. After calibration, the subharmonic (H0P5) and a harmonic of the source signal (H1P5), and other harmonics, are suppressed to at least −60 dBm.

Figure 16:
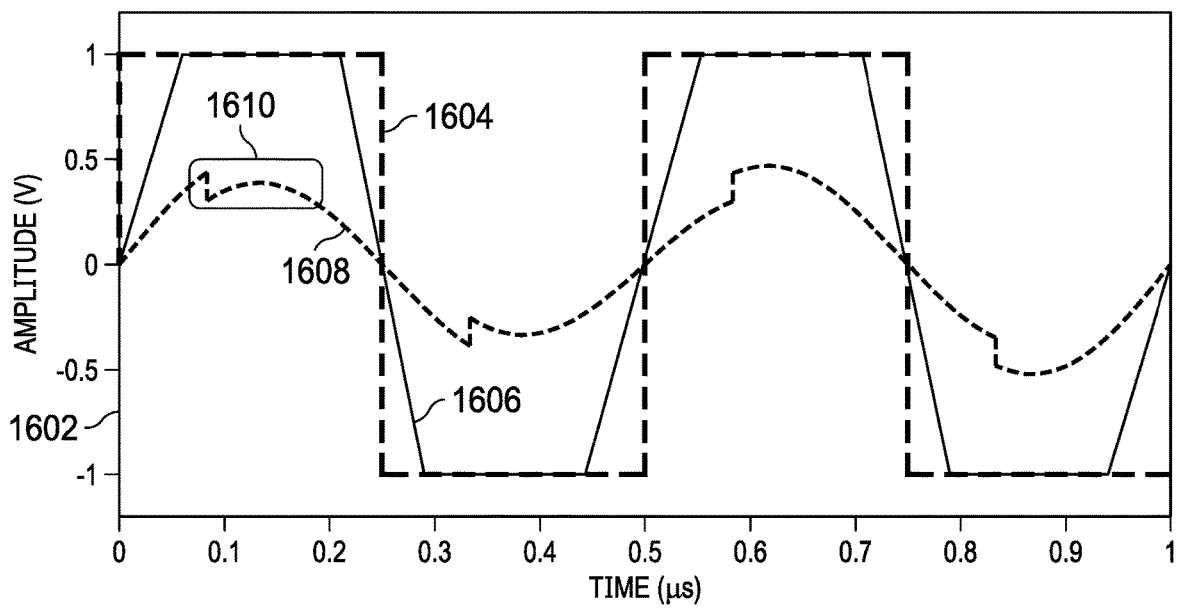
FIG. 16 is a graph diagram depicting example waves that illustrate subharmonic cancelation when operating the circuit shown in FIG. 10.

FIG. 16 is a graph diagram 1600 depicting example waves that illustrate subharmonic cancelation when operating the circuit shown in FIG. 10. Graph diagram 1600 includes a graph 1602 including plots 1604, 1606, and 1608 of amplitude (in V) versus time (in μS) and representing various waves. Namely, plot 1604 represents a square wave corresponding to a mixing signal out of an ideal hard-limiter. However, a practical circuit implementation may include hard-limiters that are non-ideal. Accordingly, the "square" wave corresponding to the mixing signal out of the non-ideal hard-limiter is more akin to the plot 1606 having finite rise and fall times. As such, subharmonic correction to a corrupted clock signal (represented by plot 1608) can be performed in a smaller window 1610. Notwithstanding, the IQ mismatch generated by most practical circuits is much lower than this available margin.

Figure 17:
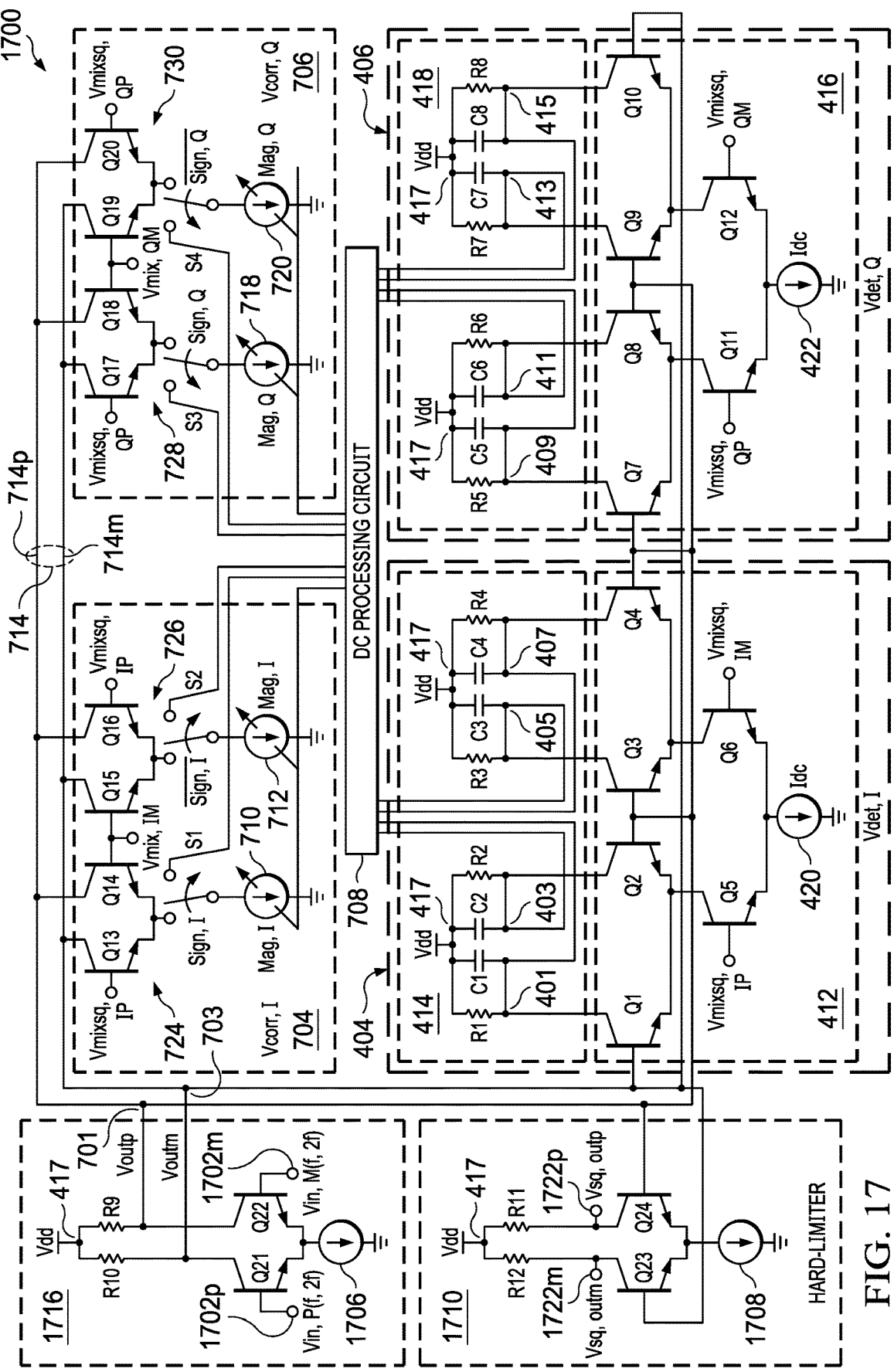
FIG. 17 is a schematic circuit diagram depicting an example circuit for subharmonic detection and cancelation that implements the circuit shown in FIG. 10.

FIG. 17 is a schematic circuit diagram 1700 depicting an example circuit for subharmonic detection and cancelation that implements the circuit shown in FIG. 10. As illustrated, circuit 1700 includes $V_{det, I}$ 404 and $V_{det, Q}$ 406 (of FIGS. 4 and 7), $V_{corr, I}$ 704, $V_{corr, Q}$ 706, and DC processing circuit 708 (of FIG. 7), a subtractor 1716, and a hard-limiter 1710, each having one or more components with one or more inputs and/or outputs and/or interconnections coupled as shown between differential input terminals $1702_P$ and $1702_M$ (collectively referred to as differential input terminals 702) and differential output terminals $1722_P$ and $1722_M$ (collectively referred to as differential output terminals 722) of circuit 700.

In this example, $V_{det, I}$ 404 and $V_{det, Q}$ 406 are implemented as shown in FIG. 4 and as previously described. $V_{corr, I}$ 704, $V_{corr, Q}$ 706, and DC processing circuit 708 are implemented as shown in FIG. 7 and as previously described. Subtractor 1716 is an implementation of subtractor 1016, and hard-limiter 1710 is an implementation of hard-limiter 1010. Implementations of hard-limiters 1004 and 1006 are not shown in FIG. 17 for simplicity. However, hard-limiters 1004 and 1006 may also each be implemented using a circuit similar to hard-limiter 1710, such that the respective mixing signals received into the respective bases of transistors Q5, Q6, and Q11-Q20 are square waves instead of sinusoidal waves. Moreover, in this example, circuit 1700 is implemented as a differential circuit but need not be.

In a further example, circuit 1700 is included in or coupled to frequency multipliers 122 and 142 of transceiver circuit 100 to detect and cancel subharmonic components in CLK. In the example transmitter circuitry 102, differential input terminals 1702 are coupled to the output of frequency multiplier 122. Moreover, differential output terminals 1722 are coupled to mixer 112. Similarly, in the example receiver circuitry 104, differential input terminals 1702 are coupled to the output of frequency multiplier 142. Moreover, differential output terminals 1722 are coupled to mixer 130.

As further shown in FIG. 17, subtractor 1716 includes resistors R9 and R10, transistors Q21 and Q22, and a current source 1706. Hard-limiter 1710 includes resistors R11 and R12, transistors Q23 and Q24, and a current source 1708. Transistors Q21-Q24 are illustrated as NPN BJTs. However, in other examples, one or more of transistors Q21-Q24 may be a PNP BJT or a FET such as a MOSFET.

As shown with respect to subtractor 1716, current source 1706 has a first terminal coupled to the respective emitters of transistors Q21 and Q22 and a second terminal coupled to electrical ground. The base of transistor Q21 is coupled to input terminal $1702_P$, and the collector of transistor Q21 is coupled to node 703. The base of transistor Q22 is coupled to input terminal $1702_M$, and the collector of transistor Q22 is coupled to node 701. Resistor R10 is coupled between voltage supply node 417 and node 703. Resistor R9 is coupled between voltage supply node 417 and node 701. In operation of circuit 1700, subtractor 1716 performs subtraction in the current domain at nodes 701 and 703 to provide a corrected differential CLK wave ($V_{outp}$ and $V_{outm}$) in the voltage domain at nodes 701 and 703.

As shown with respect to hard-limiter 1710, current source 1708 has a first terminal coupled to the respective emitters of transistors Q23 and Q24 and a second terminal coupled to electrical ground. The base of transistor Q23 is coupled to node 703, and the collector of transistor Q23 is coupled to output terminal $1722_M$. The base of transistor Q24 is coupled to node 701, and the collector of transistor Q24 is coupled to output terminal $1722_P$. Resistor R11 is coupled between voltage supply node 417 and output terminal $1722_P$. Resistor R12 is coupled between voltage supply node 417 and output terminal $1722_M$.

Figure 18:
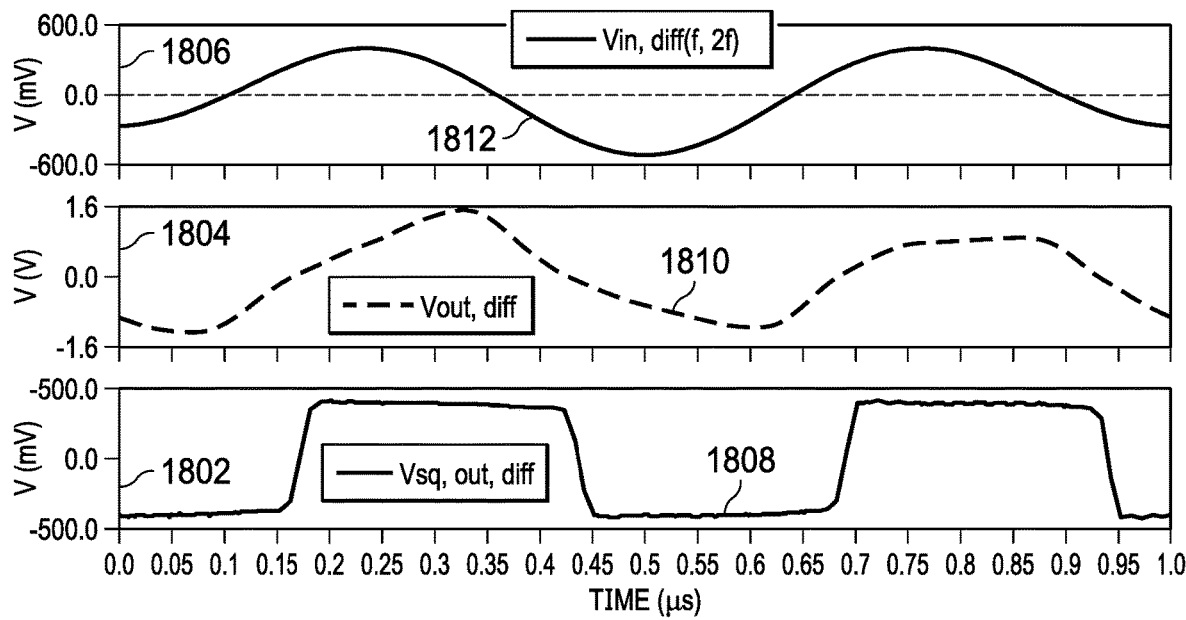
FIG. 18 is a graph diagram depicting example waves that illustrate subharmonic rejection when operating the circuit shown in FIG. 17.

FIG. 18 is a graph diagram 1800 depicting example waves that simulate subharmonic rejection when operating the circuit shown in FIG. 17. Graph diagram 1800 includes graphs 1802, 1804, and 1806 of amplitude (in V) versus time (in μS) and representing various waves. More particularly, graph 1806 includes a plot 1812 representing a sinusoidal wave $V_{in, diff (f, 2f)}$, for instance at differential input terminals 1702. Wave $V_{in, diff (f, 2f)}$ includes the fundamental component at 2f and a harmonic at f. Graph 1804 includes a plot 1810 representing a corrected clock signal $V_{out, diff}$, for instance at nodes 701 and 703. As can be seen, the corrupted wave $V_{in, diff (f, 2f)}$ is corrected by shifting its zero crossing, resulting in corrected wave $V_{out, diff}$. Graph 1802 includes a plot 1808 representing a corrected clock signal $v_{sq, out, diff}$ after passing through a hard-limiter, for instance as provided at output terminals 1722 coupled to the hard-limiter 1710. As can also be seen, hard-limiter 1710 removes at least some of the distortion caused by subtractor 1716.

In the description and in the claims, the terms "including" and "having" and variants thereof are intended to be inclusive in a manner similar to the term "comprising" unless otherwise noted. Unless otherwise stated, "about," "approximately," or "substantially" preceding a value means +/−10 percent of the stated value. In another example, "about," "approximately," or "substantially" preceding a value means +/−5 percent of the stated value. IN another example, "about," "approximately," or "substantially" preceding a value means +/−1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS., components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal", "node", "interconnect", "pad", and "pin" may be used interchangeably.

Modifications are possible in the described embodiments, and other embodiments are possible, within the scope of the claims.

What is claimed is:

1. A circuit comprising:
   a subtractor having a frequency multiplier input, a feedback input, and a subtractor output;
   a first in-phase mixer having first and second mixer inputs and a first mixer output, the first mixer input coupled to the subtractor output;
   a first quadrature mixer having third and fourth mixer inputs and a second mixer output, the third mixer input coupled to the subtractor output;
   a first filter circuit having a first filter input and a first filter output, the first filter input coupled to the first mixer output;
   a second filter circuit having a second filter input and a second filter output, the second filter input coupled to the second mixer output;
   a processing circuit having first and second inputs and first and second outputs, the first input of the processing circuit coupled to the first filter output, the second input of the processing circuit coupled to the second filter output;
   a second adjustable in-phase mixer having fifth and sixth mixer inputs and a third mixer output, the fifth mixer input coupled to the first output of the processing circuit, and the sixth mixer input coupled to the second mixer input, the second adjustable in-phase mixer including a first adjustable current source; and
   a second adjustable quadrature mixer having seventh and eighth mixer inputs and a fourth mixer output, the seventh mixer input coupled to the second output of the processing circuit, the eighth mixer input coupled to the fourth mixer input, each of the third and fourth mixer outputs coupled to the feedback input, the second adjustable quadrature mixer including a second adjustable current source.

2. The circuit of claim 1, further comprising:
   a first hard-limiter having an output coupled to the second and sixth mixer inputs;
   a second hard-limiter having an output coupled to the fourth and eighth mixer inputs; and
   a third hard-limiter having an output coupled to the frequency multiplier input.

3. The circuit of claim 1, further comprising:
   a first hard-limiter having an output coupled to the second and sixth mixer inputs;
   a second hard-limiter having an output coupled to the fourth and eighth mixer inputs; and
   a third hard-limiter having an input and an output, the input of the third hard-limiter coupled to the subtractor output.

4. The circuit of claim 1, wherein:
   the first adjustable current source is coupled to the first output of the processing circuit; and
   the second adjustable current source is coupled to the second output of the processing circuit.

5. The circuit of claim 1, wherein the first adjustable current source has a first current source input and a first current source terminal, the first current source input coupled to the first output of the processing circuit, and the second adjustable current source has a second current source input and a second current source terminal, the second current source input coupled to the second output of the processing circuit, and wherein:

the second adjustable in-phase mixer includes:
first and second transistors each having a control terminal, a first current terminal and a second current terminal, the first current terminals coupled to the first current source terminal, the second current terminals coupled to the feedback input, and the control terminals coupled to the second mixer input; and
the second adjustable quadrature mixer includes:
third and fourth transistors each having a control terminal, first current terminal and a second current terminal, the first current terminals of the third and fourth transistors coupled to the second current source terminal, the second current terminals of the third and fourth transistors coupled to the feedback input, and the control terminals of the third and fourth transistors coupled to the fourth mixer input.

6. The circuit of claim 1, wherein:
the processing circuit has third, fourth, fifth, and sixth outputs;
the second adjustable in-phase mixer includes:
a first switch having first, second, and third switch terminals, the first switch terminal coupled to the first and second transistors each having a control terminal, a first current terminal and a second current terminal, the first current terminals coupled to a first current source terminal of the first adjustable current source, the second current terminals coupled to the feedback input, and the control terminals coupled to the second mixer input; and
the second adjustable quadrature mixer includes:
third and fourth transistors each having a control terminal, a first current terminal and a second current terminal, the first current terminals of the third and fourth transistors coupled to a second current source terminal of the second adjustable current source, the second current terminals of the third and fourth transistors coupled to the feedback input, and the control terminals of the third and fourth transistors coupled to the fourth mixer input.

7. A method comprising:
receiving a wave from a frequency multiplier;
mixing the wave with a first mixing signal to generate a first mixed signal including a first direct current (DC) component;
mixing the wave with a second mixing signal to generate a second mixed signal including a second DC component, the second mixing signal is phase-shifted from the first mixing signal;
determining that the first and second DC components indicate a subharmonic component;
responsive to the determining, adjusting at least one of a magnitude or a polarity of a current of an adjustable mixer to provide a feedback correction signal; and
combining the feedback correction signal with the wave from the frequency multiplier to generate a corrected wave having a reduced subharmonic.

8. The method of claim 7, wherein the current of the adjustable mixer is provided by an adjustable current source of the adjustable mixer.

9. A method comprising:
receiving a wave from a frequency multiplier;
mixing the wave with a first mixing signal to generate a first mixed signal including a first direct current (DC) component;
mixing the wave with a second mixing signal to generate a second mixed signal including a second DC component, the second mixing signal is phase-shifted from the first mixing signal;
determining that the first and second DC components indicate a subharmonic component;
responsive to the determining, adjusting a parameter of an adjustable mixer to provide a feedback correction signal;
combining the feedback correction signal with the wave from the frequency multiplier to generate a corrected wave having a reduced subharmonic;
filtering the first mixed signal to provide the first DC component; and
filtering the second mixed signal to provide the second DC component.

10. The method of claim 7, wherein:
the first mixing signal is a first square wave; and
the second mixing signal is second square wave that is about 90 degrees phase-shifted from the first square wave.

11. The method of claim 7, further comprising hard-limiting the wave before mixing the wave with the first and second mixing signals, and wherein:
the first mixing signal is a first output wave from a first hard-limiter; and
the second mixing signal is a second output wave from a second hard-limiter.

12. A circuit comprising:
an in-phase mixer having a first mixer input and a first mixer output;
a quadrature mixer having a second mixer input and a second mixer output, the first mixer input coupled to the second mixer input;
a first filter circuit having a first filter input and a first filter output, the first filter input coupled to the first mixer output;
a second filter circuit having a second filter input and a second filter output, the second filter input coupled to the second mixer output;
a processing circuit having a first input and a second input, the first input of the processing circuit coupled to the first filter output, the second input of the processing circuit coupled to the second filter output, the processing circuit configured to detect a subharmonic component of a wave at the first mixer input and the second mixer input using a first direct current (DC) component at the first input of the processing circuit and a second DC component at the second input of the processing circuit; and
correction circuitry coupled to the processing circuit and configured to provide a feedback signal to adjust a signal at the first and second mixer inputs.

13. The circuit of claim 12, wherein the first mixer has a third mixer input, and the second mixer includes a fourth mixer input, the circuit further comprising:
a first hard-limiter having an output coupled to the third mixer input; and
a second hard-limiter having an output coupled to the fourth mixer input.

14. The circuit of claim 12, wherein the first and second filters are low-pass filters.

15. The circuit of claim 12, wherein the first and second filters are integrator circuits.

16. The circuit of claim 12, wherein the correction circuitry includes:
mixing circuitry coupled to the processing circuitry, and
adjusting circuitry configured to provide the feedback signal.

17. The circuit of claim 16, wherein the mixing circuitry includes:
a first mixer configured to mix an output of the first filter circuit with a first hard-limit signal, and output a first mixed signal,
a second mixer configured to mix an output of the second filter circuit with a second hard-limit signal, and output a second mixed signal.

18. The circuit of claim 17, wherein the mixing circuitry further includes an adder configured to receive the first and second mixed signals and output a combined signal to the adjusting circuitry.

19. The circuit of claim 18, further comprising input circuitry having a signal input, a feedback input configured to receive the feedback signal, and an output coupled to the first and second mixer inputs.

* * * * *